United States Patent
Yamamoto et al.

(10) Patent No.: US 8,283,746 B2
(45) Date of Patent: Oct. 9, 2012

(54) SOLID-STATE IMAGING DEVICE AND METHOD OF MANUFACTURING SOLID-STATE IMAGING DEVICE

(75) Inventors: Yuichi Yamamoto, Tokyo (JP); Hayato Iwamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/723,241

(22) Filed: Mar. 19, 2007

(65) Prior Publication Data

US 2007/0215971 A1 Sep. 20, 2007

Related U.S. Application Data

(60) Continuation of application No. 11/441,112, filed on May 26, 2006, now Pat. No. 7,709,969, which is a division of application No. 10/979,116, filed on Nov. 3, 2004, now Pat. No. 7,101,726.

(30) Foreign Application Priority Data

Nov. 17, 2003 (JP) ................................ 2003-386933

(51) Int. Cl.
*H01L 21/30* (2006.01)
(52) U.S. Cl. .......... 257/459; 257/53; 257/797; 257/448; 257/734; 257/781
(58) Field of Classification Search .......... 257/E31.127, 257/E31.054, 53, 797, 432, 443, 448, 459, 257/734, 736, 750, 781
See application file for complete search history.

(56) References Cited

U.S. PATENT DOCUMENTS

| | | | |
|---|---|---|---|
| 6,759,262 B2 * | 7/2004 | Theil et al. | 438/48 |
| 6,809,008 B1 * | 10/2004 | Holm et al. | 438/455 |
| 6,930,336 B1 * | 8/2005 | Merrill | 257/292 |
| 7,615,808 B2 * | 11/2009 | Pain et al. | 257/228 |
| 2004/0041224 A1 * | 3/2004 | Chao et al. | 257/444 |
| 2006/0249803 A1 * | 11/2006 | Yamamoto et al. | 257/432 |

FOREIGN PATENT DOCUMENTS

| | | | |
|---|---|---|---|
| JP | 04177877 A | * | 6/1992 |
| JP | 06-283702 | | 10/1994 |
| JP | 2001177100 A | * | 6/2001 |
| JP | 2003-031785 | | 1/2003 |
| JP | 2003-078826 | | 3/2003 |
| JP | 2003-273343 | | 9/2003 |

OTHER PUBLICATIONS

Japanese Office Action: Application No. 2003-386933; Dated: Jul. 10, 2007.

* cited by examiner

*Primary Examiner* — Michael Shingleton
(74) *Attorney, Agent, or Firm* — Rader Fishman & Grauer, PLLC

(57) ABSTRACT

A solid state imaging device having a back-illuminated type structure in which a lens is formed on the back side of a silicon layer with a light-receiving sensor portion being formed thereon. Insulating layers are buried into the silicon layer around an image pickup region, with the insulating layer being buried around a contact layer that connects an electrode layer of a pad portion and an interconnection layer of the surface side. A method of manufacturing such a solid-state imaging device is also provided.

10 Claims, 21 Drawing Sheets

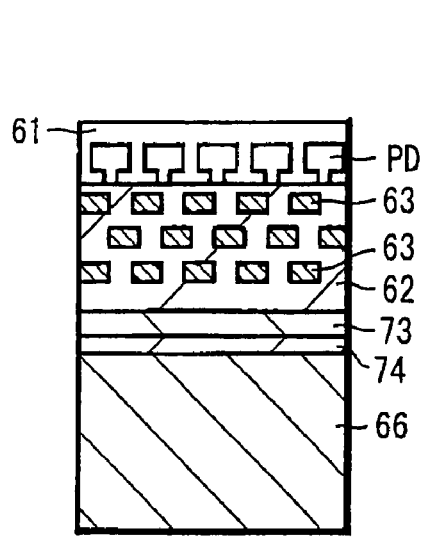
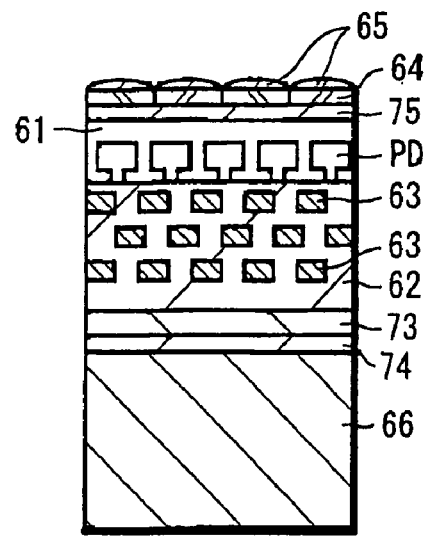
FIG. 3D (RELATED ART)
FIG. 3E (RELATED ART)
FIG. 4
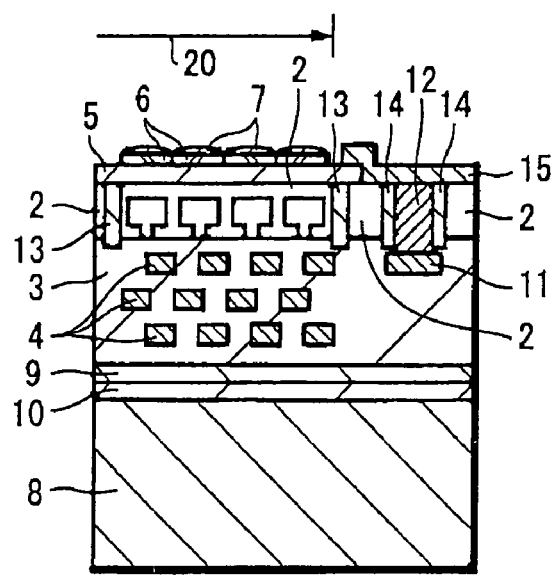

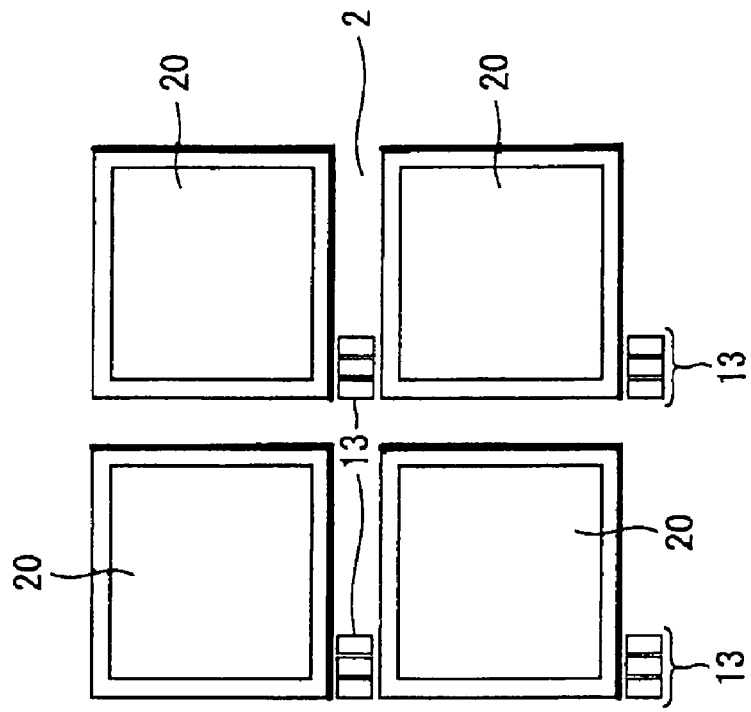
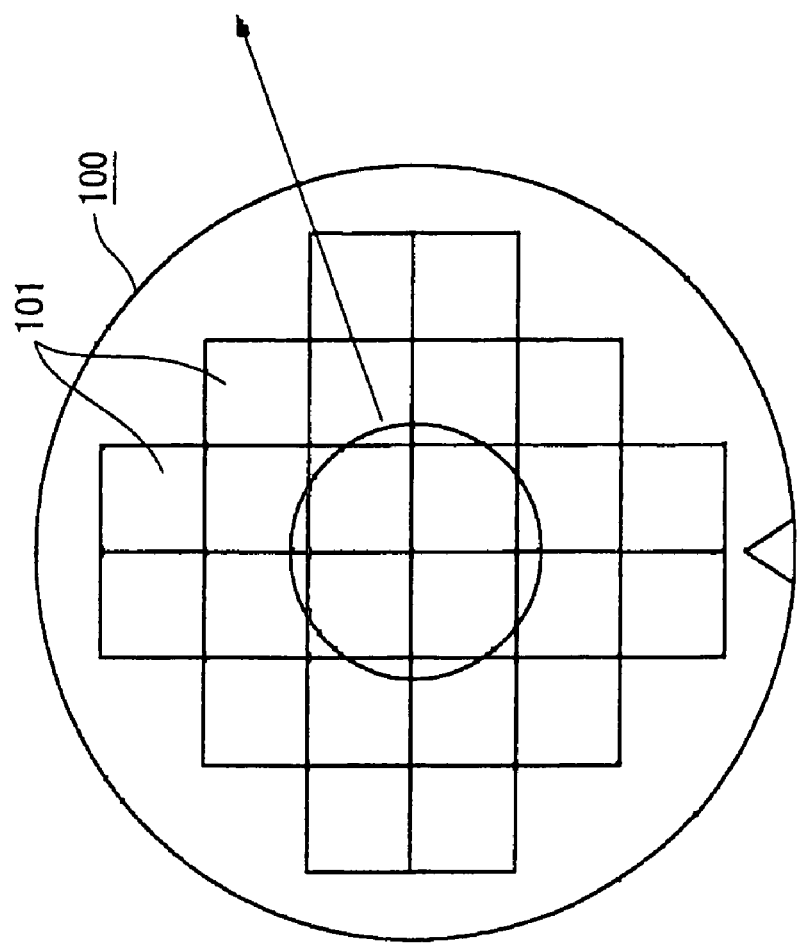

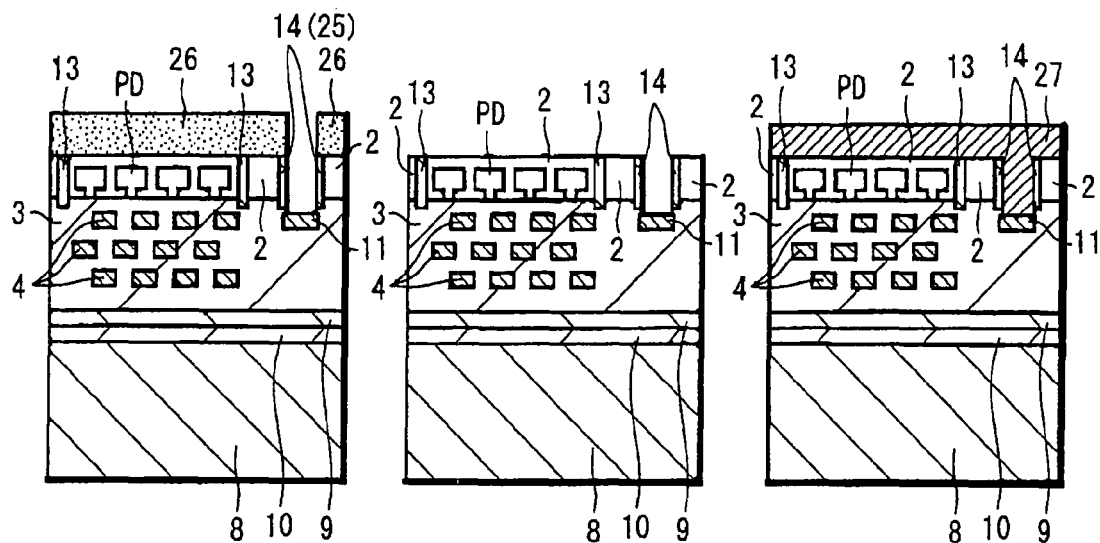
*FIG.11A*  *FIG.11B*  *FIG.11C*
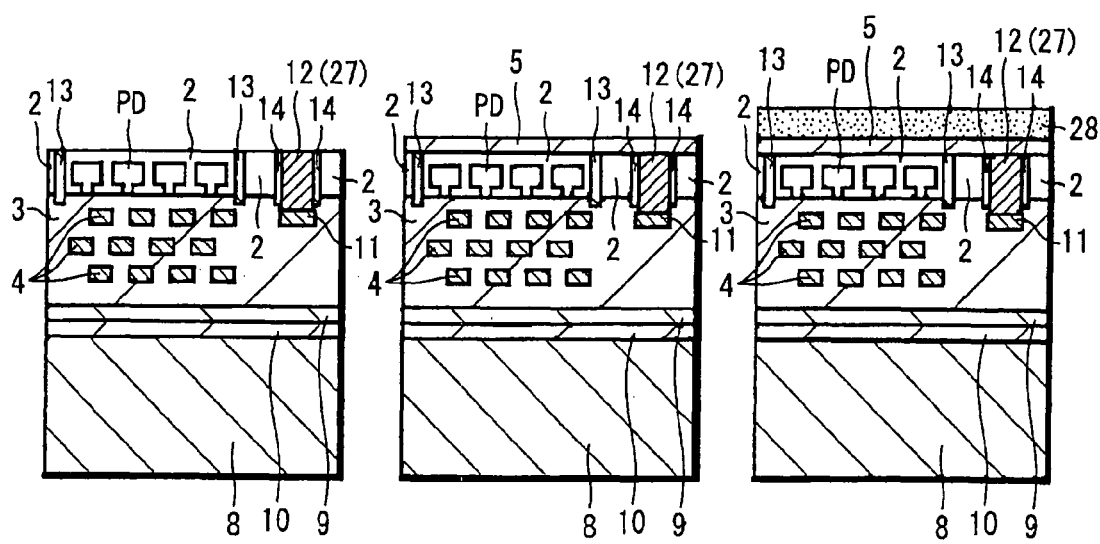
*FIG.12A*  *FIG.12B*  *FIG.12C*

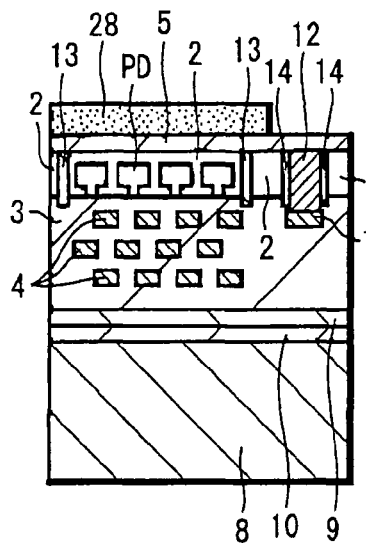
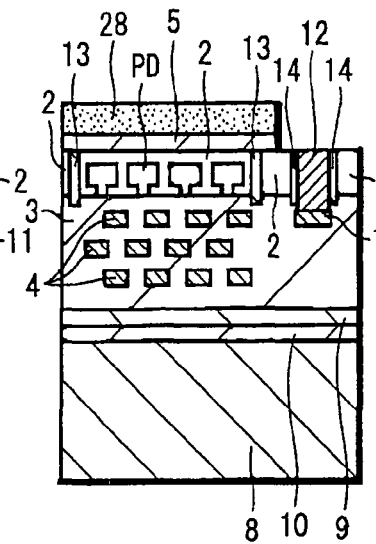
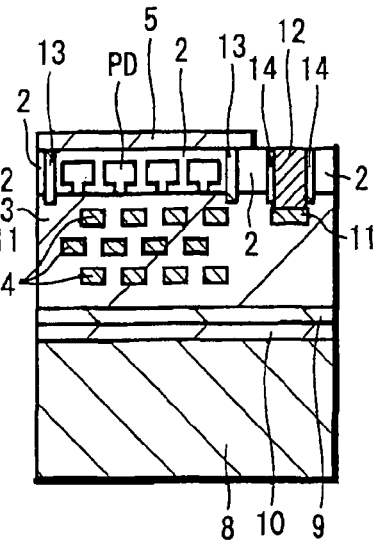
*FIG.13A*  *FIG.13B*  *FIG.13C*
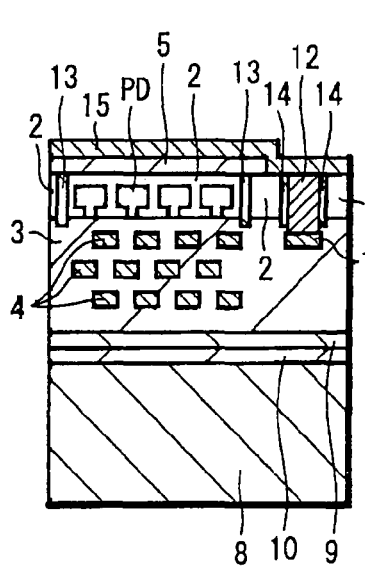
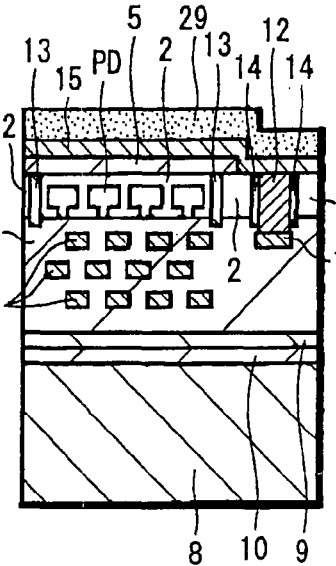
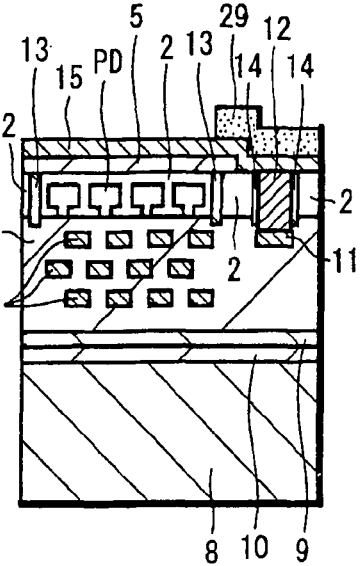
*FIG.14A*  *FIG.14B*  *FIG.14C*

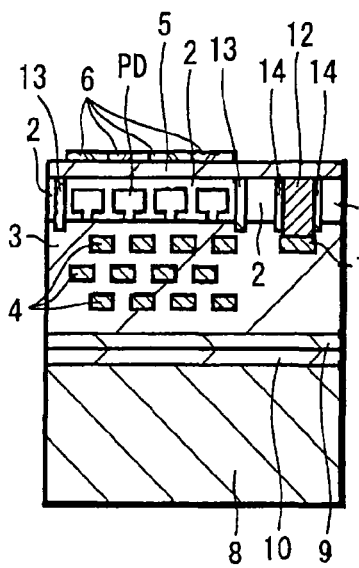 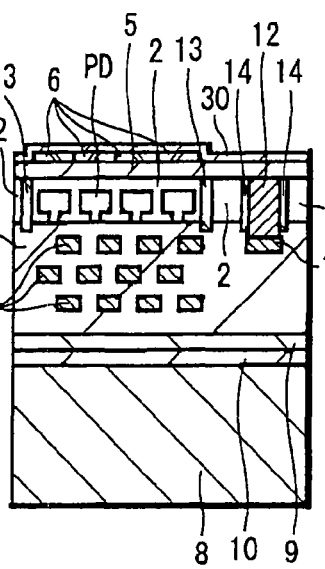 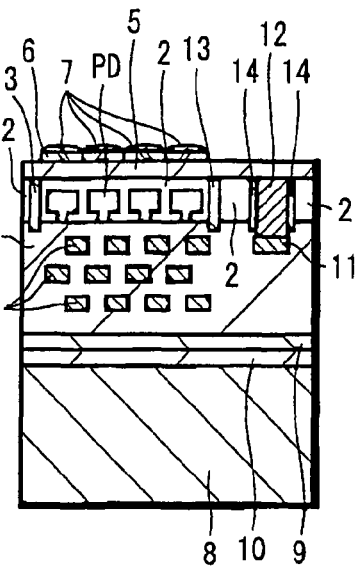
FIG.17A    FIG.17B    FIG.17C
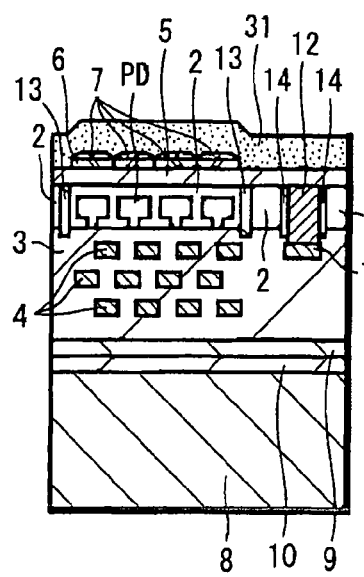 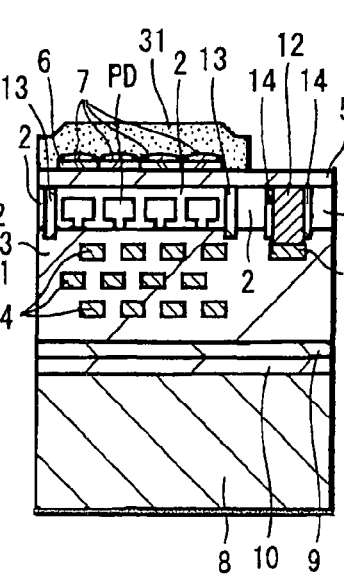 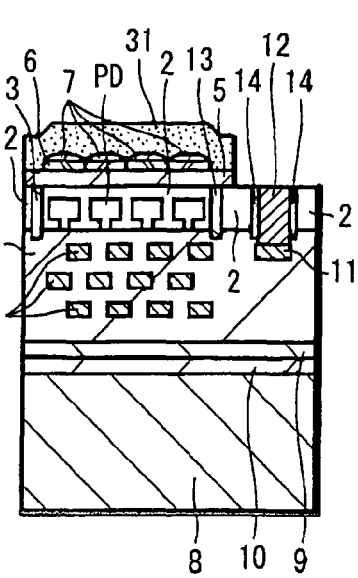
FIG.18A    FIG.18B    FIG.18C

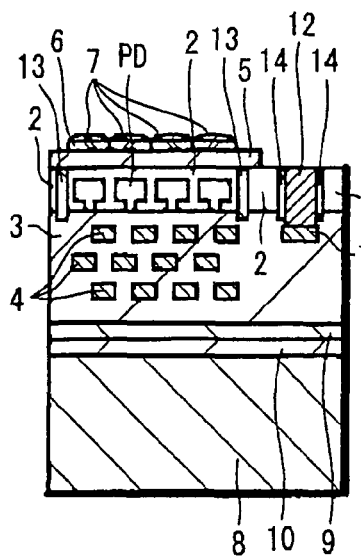
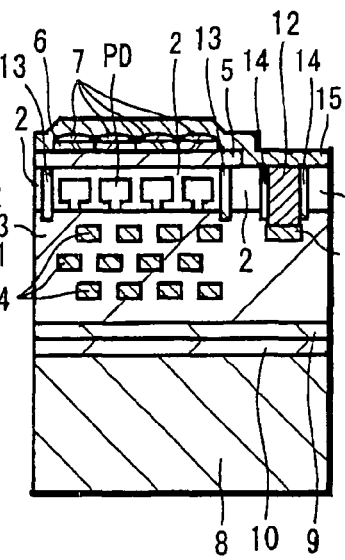
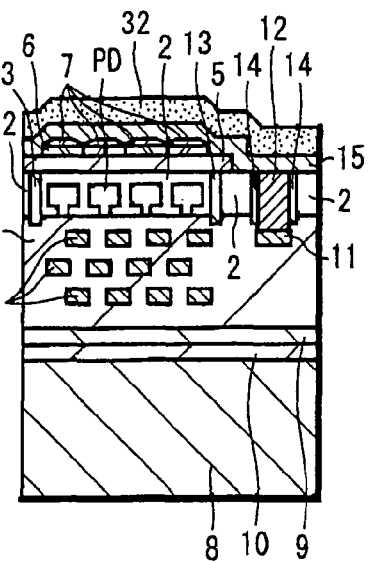
FIG.19A  FIG.19B  FIG.19C
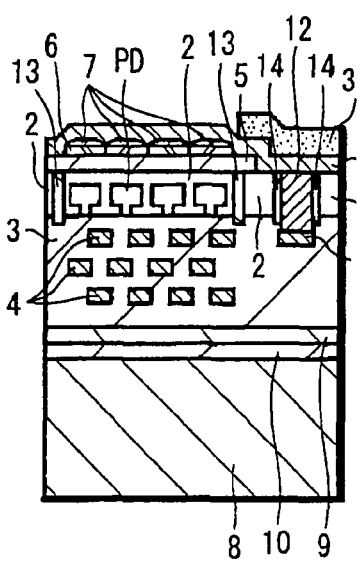
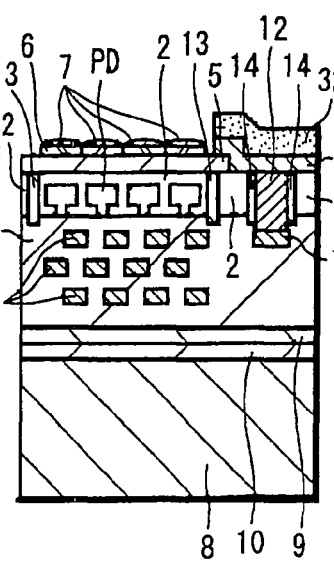
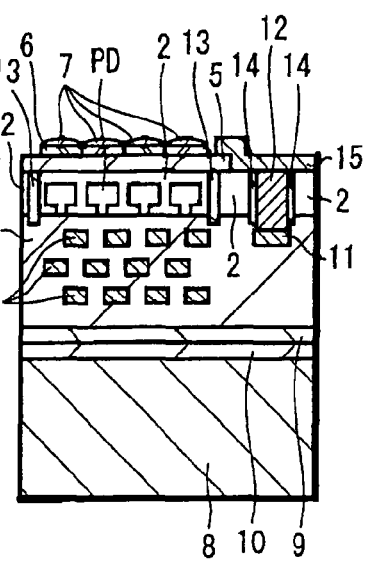
FIG.20A  FIG.20B  FIG.20C

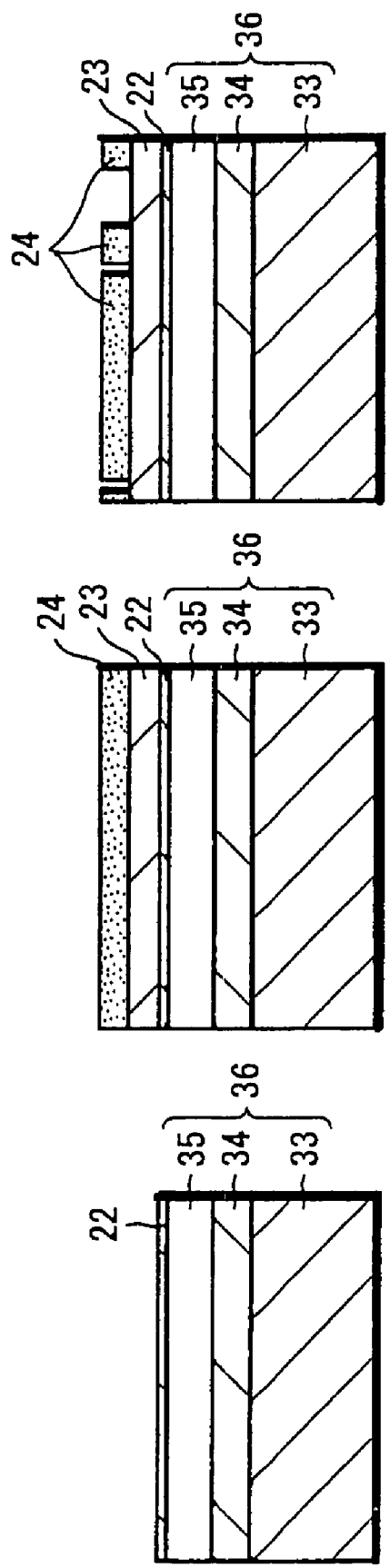

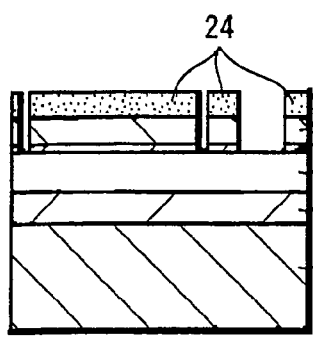 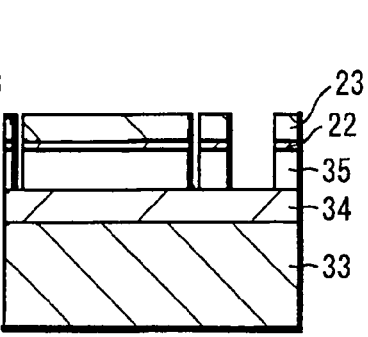
FIG.22A   FIG.22B   FIG.22C
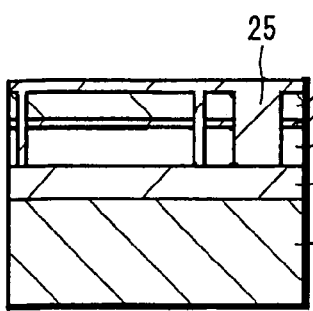 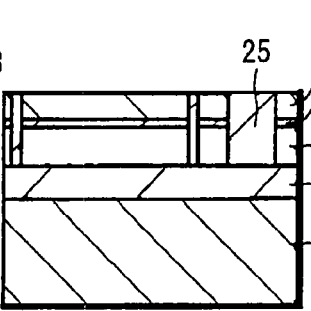 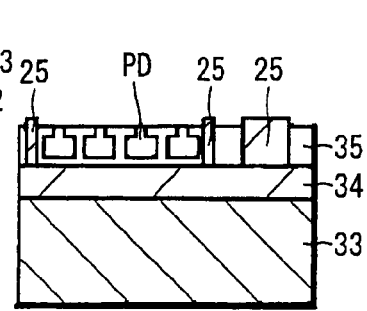
FIG.23A   FIG.23B   FIG.23C

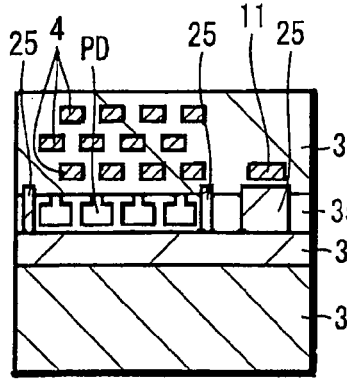
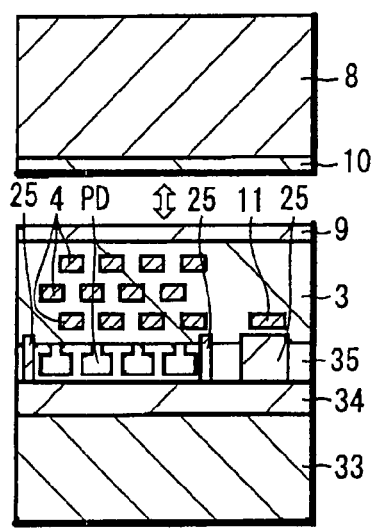
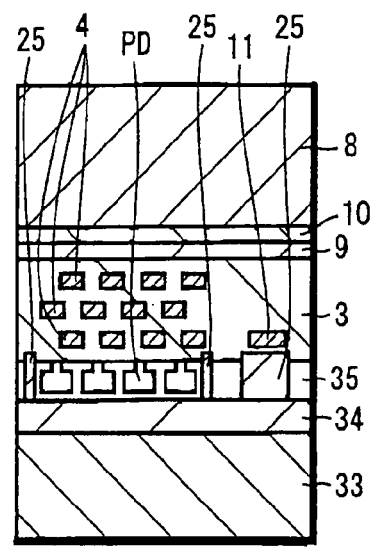
FIG.24A  FIG.24B  FIG.24C
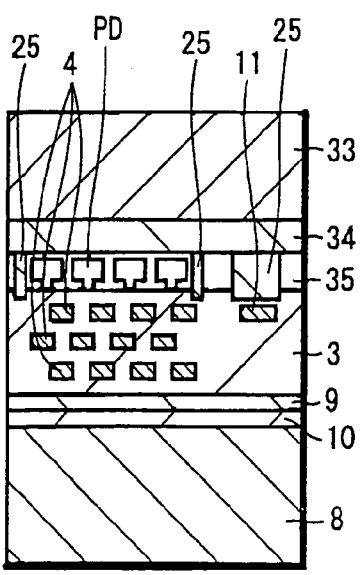
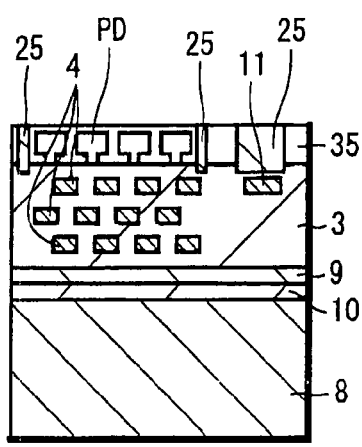
FIG.25A  FIG.25B

FIG. 26
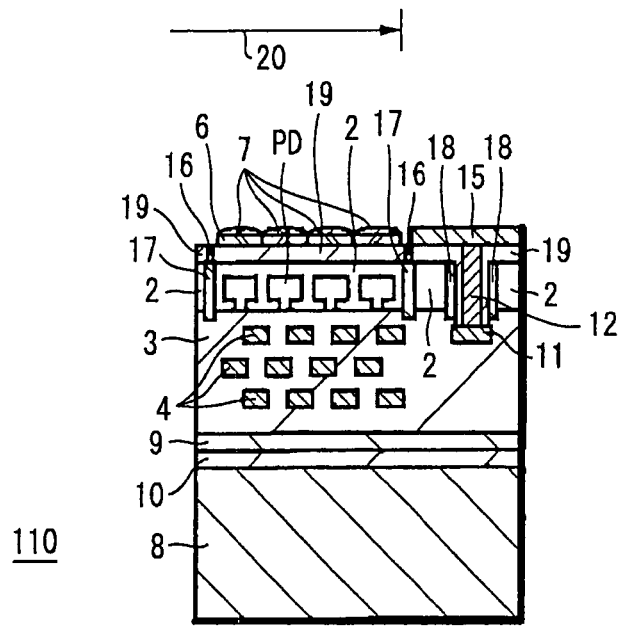
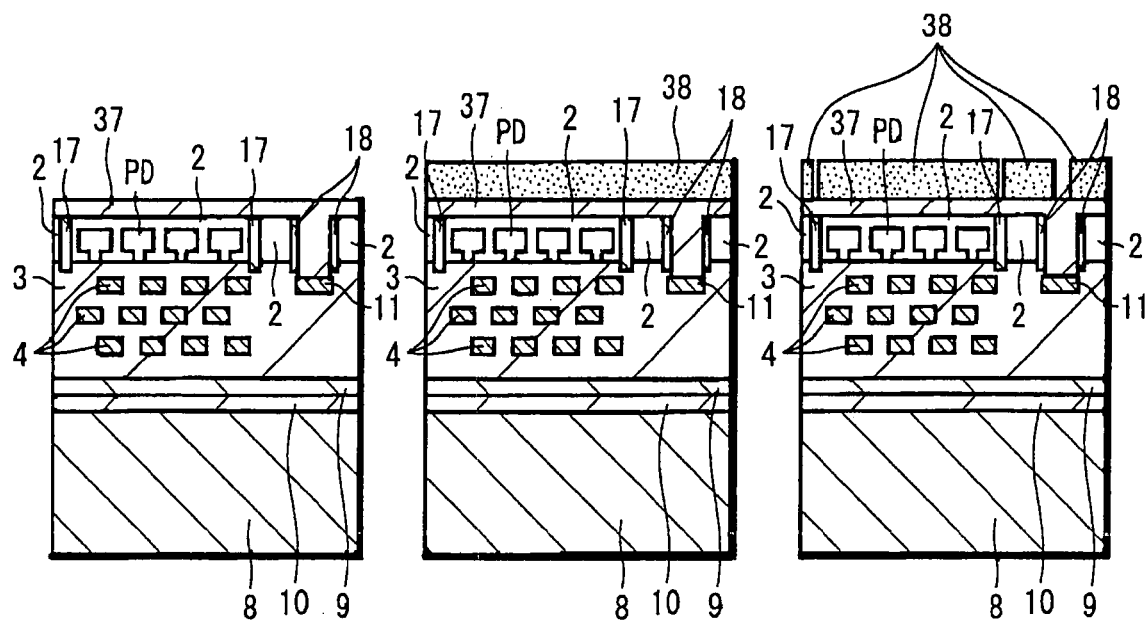
FIG. 27A    FIG. 27B    FIG. 27C

FIG.32
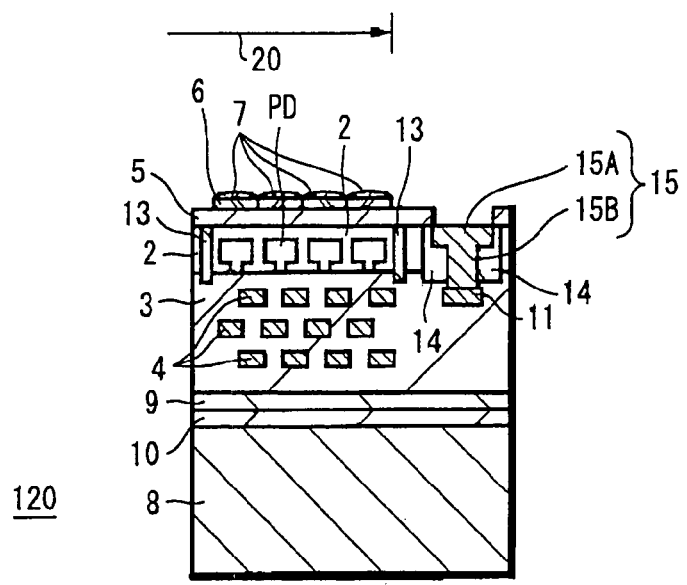
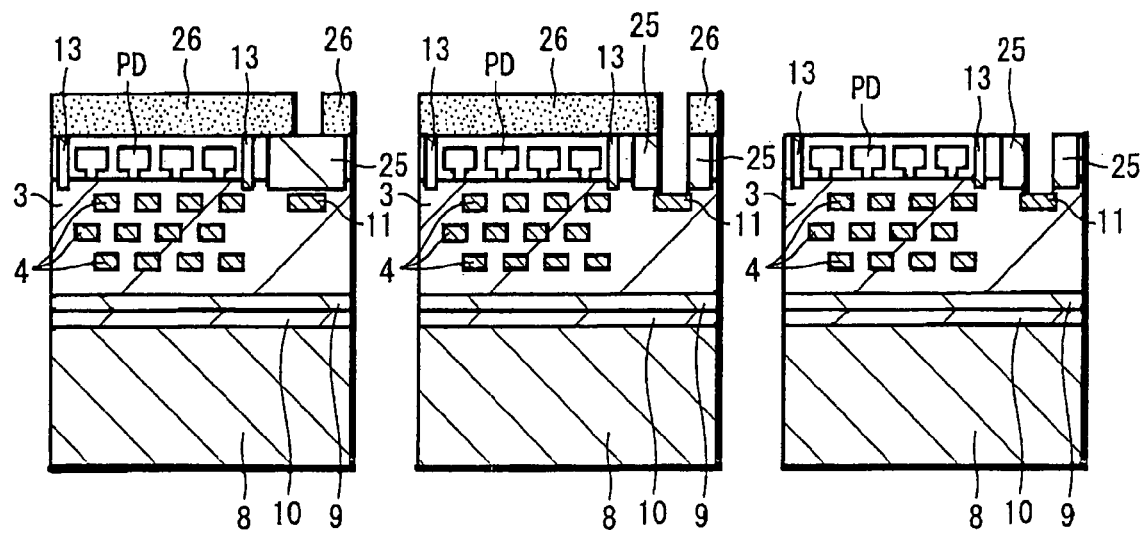
FIG.33A  FIG.33B  FIG.33C

SOLID-STATE IMAGING DEVICE AND METHOD OF MANUFACTURING SOLID-STATE IMAGING DEVICE

CROSS REFERENCE TO RELATED APPLICATIONS

The present application is a Continuation Application of the patent application Ser. No. 11/441,112, filed May 26, 2006, now U.S. Pat. No. 7,709,929, which is a Divisional Application of U.S. patent application Ser. No. 10/979,116, filed Nov. 3, 2004, now U.S. Pat. No. 7,101,726, which in turn claims priority from Japanese Application No. 2003-386933, filed Nov. 17, 2003, the entire content being incorporated by reference.

BACKGROUND OF THE INVENTION

1. Field of the Invention

The present invention relates to a solid-state imaging device having a so-called back-illuminated structure for illuminating light on a light-receiving sensor portion from the back side opposite to electrodes and interconnections and a method of manufacturing such a back-illuminated type solid-state imaging device.

2. Description of the Related Art

It has been customary that a solid-state imaging device has a surface-illuminated type structure with electrodes and interconnections formed on a substrate to illuminate light on a light-receiving sensor portion from above the electrodes and the interconnections.

FIG. 1 of the accompanying drawings is a schematic cross-sectional view showing a solid-state imaging device having a surface-illuminated type structure.

A solid-state imaging device, generally depicted by the reference numeral 50 in FIG. 1, is a CMOS (complementary metal-oxide semiconductor) solid-state imaging device having a surface illuminated type structure.

As shown in FIG. 1, a photodiode PD comprising a light-receiving sensor portion of each pixel is formed within a silicon substrate 51, and an interconnection layer 53 of a multi-layer is formed on the silicon substrate 51 through an interlayer insulator 52. Further, a color filter 54 and a lens 55 are formed on the layer above the interconnection layer 53.

Light L is passed from the lens 55 through the interlayer insulator 52 between the color filter 54 and the interconnection layer 53 and introduced into the photodiode PD of the light-receiving sensor portion.

However, as the solid-state imaging device is microminiaturized increasingly, the pitch of interconnection becomes narrower and the interconnection layer 53 is formed of many more layers so that a distance between the lens 55 and the photodiode PD of the light-receiving sensor portion is increased unavoidably.

As a consequence, as shown hatched in FIG. 1, a part Lx of the light L, which became incident on the solid-state imaging device 50 obliquely, is interrupted by the interconnection layer 53 and cannot be introduced into the photodiode PD, thereby causing a bad phenomenon such as shading to occur.

As a plan for improving the above bad phenomenon, a back-illuminated type solid-state imaging device has been proposed to illuminate light on a light-receiving sensor portion from the opposite side of the surface on which interconnections are formed (for example, see Cited patent reference 1).

While the cited patent reference 1 has described a CCD (charge-coupled device) solid-state imaging device having a back-illuminated type structure, it is considered that this back-illuminated type structure can be applied to the CMOS type solid-state imaging device.

FIG. 2 is a schematic cross-sectional view showing an example of a CMOS type solid-state imaging device with a back-illuminated type structure being applied thereto.

As shown in FIG. 2, a photodiode PD comprising a light-receiving sensor portion of each pixel is formed within a single crystal silicon layer 61, and a color filter 64 and a lens 65 are formed on the single crystal silicon layer 61. The single crystal silicon layer 61 is formed of a silicon substrate whose thickness is reduced, as will be described later on.

On the other hand, a multilayer interconnection layer 63 is formed under the single crystal silicon layer 61 through an interlayer insulator 62, and the interlayer insulator 62 in which the interconnection layer 63 is formed is supported by a supporting substrate 66 formed under the interconnection layer 63.

Then, light L is introduced from the lens 65 into the photodiode PD of the light-receiving sensor portion formed on the single crystal silicon layer 61.

Assuming that the side in which the interconnection layer 63 is formed is the surface side, the light L is introduced into the photodiode PD from the back side. Thus, this structure of the above CMOS type solid-state imaging device is referred to as a "back-illuminated type structure".

In the back-illuminated type solid-state imaging device like the solid-state imaging device 60 shown in FIG. 2, the incident light is not interrupted by the interconnection layer 63 so that an effective vignetting factor relative to oblique incident light can reach 100%.

Accordingly, it can be expected much that sensitivity of this back-illuminated type solid-state imaging device can be improved considerably and that this back-illuminated type solid-state imaging device will be free from the shading.

The solid-state imaging device 60 shown in FIG. 2 can be manufactured as follows.

First, the photodiode PD 60 comprising the light-receiving sensor portion is formed near the surface of a silicon substrate 71 by a suitable method such as ion implantation. Then, an interconnection layer 63A of a first layer is formed on the silicon substrate 71 through a gate insulating film 72 and the interconnection layer 63 following the second layer is formed through the interlayer insulator 62, in that order (see FIG. 3A).

Then, as shown in FIG. 3B, an $SiO_2$ layer 73 is deposited on the surface of the insulating layer 62 and the surface thereof is polished. At the same time, a silicon substrate is prepared as the supporting substrate 66 and an $SiO_2$ layer 74 is formed on the surface of the supporting substrate 66. These $SiO_2$ layers 73, 74 are bonded together in an opposing fashion.

Subsequently, as shown in FIG. 3C, the resultant product is inverted up and down so that the side of the supporting substrate 66 may be directed to the lower direction.

Next, as shown in FIG. 3D, the silicon substrate 71 is reduced in thickness by polishing the surface of the silicon substrate 71 and thereby the single crystal silicon layer 61 in which the photodiode PD is formed and which has a predetermined thickness is obtained.

Next, as shown in FIG. 3E, the color filter 64 and the lens 65 are formed on the single crystal silicon layer 61 through a planarized layer 75 (not shown in FIG. 2).

Thereafter, the supporting substrate 66 is reduced in thickness according to the need.

In this manner, it is possible to manufacture the solid-state imaging device 60 shown in FIG. 2.

[Cited patent reference 1]: Official gazette of Japanese laid-open patent application No. 6-283702 (FIGS. 5A, 5B)

While the lens 65 is formed on the single crystal silicon layer 61 in the final process (FIG. 3E) of the manufacturing processes shown in FIGS. 3A to 3E, at that time, the lens 65 has to be formed in alignment with the photodiode PD that has already been formed so that an alignment mark is indispensable to such final process (FIG. 3E).

However, in the structure of the back-illuminated type solid-state imaging device according to the related art, it has not been considered so far to form an alignment mark.

Also, in the back-illuminated type solid-state imaging device, since the lens is formed on the back side of the silicon substrate, it is not possible to manufacture the alignment mark of the lens relative to the photodiode by a method similar to the alignment mark producing method in the surface-illuminated type solid-state imaging device (method of forming the alignment mark on the surface of the silicon substrate).

Also, similarly, since the supporting substrate and the like are attached to the side of the interconnection layer, it is impossible to form a pad contact by an ordinary method.

For this reason, the alignment mark forming method and the pad contact forming method should be established. Otherwise, it becomes impossible to realize a back-illuminated type solid-state imaging device, and hence it becomes difficult to microminiaturize the solid-state imaging device and to improve performance such as resolution.

That is, in order to realize the back-illuminated type solid-state imaging device, there are required an alignment mark forming method for forming an alignment mark on a silicon substrate in order to align the photodiode and the lens and a pad contact forming method.

SUMMARY OF THE INVENTION

In view of the aforesaid aspect, it is an object of the present invention to provide a solid-state imaging device which can realize a back-illuminated type solid-state imaging device by forming an alignment mark for precisely aligning a photodiode of a light-receiving sensor portion and a lens and a pad contact to the back-illuminated type solid-state imaging device and a method of manufacturing a solid-state imaging device.

According to an aspect of the present invention, there is provided a solid-state imaging device including a structure comprising at least a silicon layer in which a light-receiving sensor portion for effecting photoelectric-conversion is formed, an interconnection layer formed on the surface side of this silicon layer and in which a lens is formed on the rear side opposite to the surface side of the silicon layer, an insulating layer being buried into the silicon layer around an image pickup region, the insulating layer being buried around a contact layer for connecting an electrode layer of a pad portion and the interconnection layer of the surface side.

According to the above-mentioned arrangement of the solid-state imaging device of the present invention, since this solid-state imaging device includes the structure comprising at least the silicon layer in which the light-receiving sensor portion for effecting photoelectric-conversion is formed and the interconnection layer formed on the surface side of this silicon layer and in which the lens is formed on the rear side opposite to the surface side of the silicon layer, the solid-state imaging device having the so-called back-illuminated type structure is constructed in which the lens is formed on the rear side opposite to the surface side of the silicon layer.

Then, since the insulating layer is buried into the silicon layer around the image pickup region, when the solid-state imaging device is manufactured, it becomes possible to align the light-receiving sensor portion and the lens by using this insulating layer as the alignment mark.

Also, since the insulating layer is buried around the contact layer for connecting the electrode layer of the pad portion and the interconnection layer of the surface side, the contact layer and the silicon layer can be insulated from each other by the insulating layer and the pad portion can be constructed by connecting the electrode layer to the interconnection layer of the surface side through the contact layer.

According to other aspect of the present invention, there is provided a solid-state imaging device including a structure comprising at least a first silicon layer in which a light-receiving sensor portion for effecting photoelectric-conversion is formed and which is formed of a single crystal silicon layer, an interconnection layer formed on the surface side of this first silicon layer and in which a lens is formed on the rear side opposite to the surface side of the first silicon layer, a second silicon layer formed of an amorphous silicon layer or a polycrystalline silicon layer is buried into the first silicon layer around an image pickup region, an insulating layer is formed on the first silicon layer, a metal layer is buried into the insulating layer at its portion above the second silicon layer, the insulating layer is buried around a contact layer for connecting an electrode layer of a pad portion and an interconnection layer of the surface side and the second silicon layer is buried around the insulating layer.

According to the above-mentioned arrangement of the solid-state imaging device of the present invention, since this solid-state imaging device has the structure comprising at least the first silicon layer in which the light-receiving sensor portion for effecting photoelectric-conversion is formed and the interconnection layer formed on the surface side of the first silicon layer and in which the lens is formed on the rear side opposite to the surface side of the first silicon layer, the solid-state imaging device having the so-called back-illuminated type structure is constructed in which the lens is formed on the back side opposite to the surface side of the first silicon layer.

Then, since the second silicon layer formed of the amorphous silicon layer or the polycrystalline silicon layer is buried into the first silicon layer around the image pickup region, the insulating layer is formed on the first silicon layer and the metal layer is buried into the insulating layer at its portion above the second silicon layer, when the solid-state imaging device is manufactured, it becomes possible to align the light-receiving sensor portion and the lens by using this metal layer as the alignment mark.

Also, since the insulating layer that is formed on the first silicon layer is buried around the contact layer for connecting the electrode layer of the pad portion and the interconnection layer of the surface side and the second silicon layer is buried around the insulating layer, the contact layer, the second silicon layer and the first silicon layer can be insulated from one another by the insulating layer, and the pad portion can be constructed by connecting the electrode layer to the interconnection layer of the surface side through the contact layer.

According to a further aspect of the present invention, a method of manufacturing a solid-state imaging device is a method of manufacturing a solid-state imaging device for manufacturing a solid-state imaging device including a structure comprising a silicon layer in which a light-receiving sensor portion for effecting photoelectric-conversion is formed and an interconnection layer formed on the surface side of this silicon layer and in which a lens is formed on the back side opposite to the surface side of the silicon layer. This method of manufacturing a solid-state imaging device comprises a process for forming a groove on a silicon layer around an image pickup region, a process for forming a groove on a silicon layer of a pad portion, a process for burying an insulating layer into the groove formed around the image pickup region, a process for burying the insulating layer into the groove formed on the pad portion, a process for forming the light-receiving sensor portion on the silicon layer after the insulating layer was buried around at least the image pickup region, a process for forming an interconnection layer on the surface side of the silicon layer, a process for connecting an electrode layer to the interconnection layer of the pad portion by burying a conductive material into the insulating layer buried into the groove of the pad portion and a process for forming a lens on the rear side of the silicon layer by using the insulating layer buried into the groove around the image pickup region as an alignment mark.

According to the above-mentioned method of manufacturing a solid-state imaging device of the present invention, there can be manufactured the solid-state imaging device including the structure comprising at least the silicon layer in which the light-receiving sensor portion for effecting photoelectric-conversion is formed and the interconnection layer formed on the surface side of this silicon layer and in which the lens is formed on the rear side opposite to the surface side of the silicon layer, that is, the solid-state imaging device having the so-called back-illuminated type structure.

Then, according to the above-mentioned method of manufacturing a solid-state imaging device of the present invention, since this manufacturing method comprises the process for forming the groove on the silicon layer around the image pickup region, the process for burying the insulating layer into the groove formed around the image pickup region, the process for forming the interconnection layer on the surface side of the silicon layer, the process for forming the light-receiving sensor portion on the silicon layer after the insulating layer was buried around at least the image pickup region and the process for forming the lens on the rear side of the silicon layer by using the insulating layer buried into the groove around the image pickup region as the alignment mark, it becomes possible to form the photodiode of the light-receiving sensor portion at the accurate position by using the insulating layer as the alignment mark and further it becomes possible to align the lens at the accurate position relative to the photodiode of the light-receiving sensor portion and the like.

Also, according to the present invention, this method of manufacturing a solid-state imaging device comprises the process for forming the groove on the silicon layer of the pad portion, the process for burying the insulating layer into the groove formed at the pad portion and the process for connecting the electrode layer to the interconnection layer of the pad portion by burying the conductive material into the insulating layer buried into the groove of the pad portion, the conductive material buried into the insulating layer is connected to the interconnection layer of the pad portion and the conductive material and the silicon layer are insulated from each other by the insulating layer. Thus, the pad electrode is formed by using the conductive material as the contact layer, thereby making it possible to form the pad portion.

According to the above-mentioned method of manufacturing a solid-state imaging device of the present invention, in the process for forming the groove on the silicon layer around the image pickup region, the silicon layer may be etched by using a silicon nitride layer as a mask, a silicon oxide layer may be buried into the groove as the insulating layer in the state in which the silicon nitride layer is left and the silicon oxide layer may be left only within the groove by removing the silicon oxide layer from the surface, whereafter the silicon oxide layer may be protruded on the surface by removing the silicon nitride layer and the light-receiving sensor portion may be formed on the silicon layer.

In this case, it becomes possible to form the photodiode of the light-receiving sensor portion and the like at the predetermined position by using the protruded silicon oxide layer as the alignment mark.

In the above-mentioned method of manufacturing a solid-state imaging device according to the present invention, it is possible to execute the process for forming the groove on the silicon layer around the image pickup region and the process for forming the groove on the silicon layer of the pad portion at the same time. Also, the process for burying the insulating layer into the groove formed around the image pickup region and the process for burying the insulating layer into the groove formed on the pad portion can be executed at the same time.

In this case, since the groove forming process and the process for burying the insulating layer into the groove are simultaneously around the image pickup region and the pad portion, it becomes possible to decrease the number of processes.

In the above-mentioned method of manufacturing a solid-state imaging device according to the present invention, it is further possible to separately execute the process for forming the groove on the silicon layer around the image pickup region, the process for burying the insulating layer into the groove formed around the image pickup region, the process for forming the groove on the silicon layer of the pad portion and the process for burying the insulating layer into the groove formed on the pad portion.

In this case, since the groove forming process and the process for burying the insulating layer into the groove are separately executed around the image pickup region and at the pad portion, it becomes possible to optimize the material of the insulating layer buried into the groove and the method of forming the groove in consideration of various characteristics such as a burying property and an etching rate.

Furthermore, after the insulating layer was buried into the groove formed around the image pickup region, the process for forming the light-receiving sensor portion on the silicon layer can be executed, whereafter the groove can be formed on the silicon layer of the pad portion and the insulating layer can be buried into this groove. In this case, it is possible to form the photodiode of the light-receiving sensor portion and the like with high accuracy by using the insulating layer buried into the groove formed around the image pickup region as the alignment mark. Also, since the insulating layer buried into the groove of the pad portion is not used as the alignment mark, the material of the insulating layer can be selected freely.

In the above-mentioned method of manufacturing a solid-state imaging device according to the present invention, further, a second groove narrower than the width of the insulating layer and which reaches the interconnection layer of the pad portion through the insulating layer can be formed on the insulating layer buried into the groove of the pad portion, a third groove narrower than the width of the insulating layer and which is wider than the width of the second groove can be formed on the upper portion of the second groove and then the electrode layer can be connected to the interconnection layer of the pad portion by burying the conductive material into the second and third grooves.

In this case, the conductive material within the narrow second groove can act as the contact layer and it becomes possible to use the conductive material buried into the wider third groove formed on the upper portion of the second groove as the pad electrode. As a result, the contact layer and the pad electrode can be formed at the same time.

A method of manufacturing a solid-state imaging device according to the present invention is a method of manufacturing a solid-state imaging device including a structure comprising at least a first silicon layer in which a light-receiving sensor portion for effecting photoelectric-conversion is formed, an interconnection layer formed on the surface side of this first silicon layer and a lens formed on the rear side opposite to the surface side of the first silicon layer. This solid-state imaging device manufacturing method comprises a process for forming a groove on a first silicon layer around an image pickup region, a process for forming a groove on the first silicon layer of a pad portion, a process for burying a second silicon layer made of amorphous silicon or polycrystalline silicon into a groove formed around the image pickup region, a process for burying the second silicon layer made of amorphous silicon or polycrystalline silicon into the groove formed at the pad portion, a process for forming a light-receiving sensor portion on the first silicon layer after the second silicon layer was buried around at least the image pickup region, a process for forming an interconnection layer on the surface side of the first silicon layer, a process for connecting an electrode layer to the interconnection layer by burying a conductive material into the second silicon layer buried into the groove of the pad portion through an insulating layer and a process for forming the insulating layer over the first silicon layer, burying a metal layer into the insulating layer at its portion above the second silicon layer around the image pickup region and forming a lens on the back side of the first silicon layer by using this metal layer as an alignment mark.

The above-mentioned method of manufacturing a solid-state imaging device according to the present invention is to manufacture a solid-state imaging device including a structure comprising at least a first silicon layer in which a light-receiving sensor portion for effecting photoelectric-conversion is formed, an interconnection layer formed on the surface side of this first silicon layer and a lens formed on the rear side opposite to the surface side of the first silicon layer, that is, a solid-state imaging device having a so-called back-illuminated type structure.

Then, according to the above-mentioned method of manufacturing a solid-state imaging device of the present invention, since this solid-state imaging device manufacturing method comprises the process for forming the groove on the first silicon layer around the image pickup region, the process for burying the second silicon layer made of the amorphous silicon or polycrystalline silicon into the groove formed around the image pickup region, the process for forming the light-receiving sensor portion on the first silicon layer after the second silicon layer was buried around at least the image pickup region, the process for forming the interconnection layer on the surface side of the first silicon layer and the process for forming the insulating layer over the first silicon layer, burying the metal layer into the insulating layer at its portion above the second silicon layer around the image pickup region and forming the lens on the rear side of the first silicon layer by using this metal layer as the alignment mark, it becomes possible to accurately align the photodiode of the light-receiving sensor portion and the like at the predetermined position by using the second silicon layer around the image pickup region as the alignment mark. Further, it becomes possible to form the lens with the accurate alignment relative to the photodiode of the light-receiving sensor portion and the like by using the metal layer formed on the portion above the second silicon layer around the image pickup region as the alignment mark.

Also, since the solid-state imaging device manufacturing method according to the present invention comprises the process for forming the groove on the first silicon layer of the pad portion, the process for burying the second silicon layer made of the amorphous silicon or the polycrystalline silicon into the groove formed on the pad portion and the process for connecting the conductive material to the interconnection layer by burying the conductive material into the second silicon layer buried into the groove of the pad portion through the insulating layer, the conductive material buried into the second silicon layer through the insulating layer is connected to the interconnection layer of the pad portion and the conductive material and the second silicon layer are insulated from each other by the insulating layer. In consequence, the pad electrode can be formed by using the conductive material as the contact layer, thereby making it possible to form the pad portion.

In the above-mentioned method of manufacturing a solid state image pickup device according to the present invention, further, the process for forming the groove on the first silicon layer around the image pickup region and the process for forming the groove on the first silicon layer of the pad portion can be executed at the same time. Also, the process for burying the second silicon layer into the groove formed around the image pickup region and the process for burying the second silicon layer into the groove formed at the pad portion can be executed at the same time.

In this case, since the groove forming process and the process for burying the second silicon layer into the groove are executed around the image pickup region and at the pad portion at the same time, it becomes possible to decrease the number of the processes.

In the above-mentioned method of manufacturing a solid-state imaging device according to the present invention, further, the process for forming the first silicon layer around the image pickup region and the process for burying the second silicon layer into the groove formed around the image pickup region; and the process for forming the groove on the first silicon layer of the pad portion and the process for burying the second silicon layer into the groove formed at the pad portion can be executed separately.

In this case, since the groove forming process and the process for burying the second silicon layer into the groove are executed around the image pickup region and at the pad portion separately, it becomes possible to optimize the material (amorphous silicon or polycrystalline silicon) of the second silicon layer buried into the groove and the forming method in consideration of various characteristics such as a burying property and an etching rate.

Further, after the second silicon layer was buried into the groove formed around the image pickup region, the light-receiving sensor portion can be formed on the first silicon layer, whereafter the groove can be formed on the first silicon layer of the pad portion and the second silicon layer can be buried into this groove. In this case, it becomes possible to form the photodiode of the light-receiving sensor portion and the like accurately by using the second silicon layer buried into the groove formed around the image pickup region as the alignment mark. Also, since the second silicon layer buried into the groove of the pad portion is not used as the alignment mark, the material can be selected freely.

In the above-mentioned method of manufacturing a solid-state imaging device according to the present invention, further in the process for forming the groove on the first silicon layer around the image pickup region, the first silicon layer may be etched by using the insulating layer as a mask, the second silicon layer may be buried into the groove in the state in which the insulating layer is left, the second silicon layer may be left only within the groove by removing the second silicon layer from the surface, the second silicon layer may be protruded on the surface by removing the insulating layer and the light-receiving sensor portion may be formed on the first silicon layer.

In this case, it becomes possible to form the photodiode of the light-receiving sensor portion and the like at the predetermined position by using the thus protruded second silicon layer as the alignment mark.

According to the above-mentioned present invention, it becomes possible to align the light-receiving sensor portion (photodiode, etc.) and the lens by using the insulating layer buried into the groove around the image pickup region or the second silicon layer buried into the groove around the image pickup region and the metal layer formed on the second silicon layer as the alignment mark.

In consequence, also in the solid-state imaging device having the back-illuminated type structure, it becomes possible to align the light-receiving sensor portion (photodiode, etc.) and the lens at the predetermined position accurately.

Further, according to the present invention, it becomes possible to form a pad by connecting the electrode layer and the interconnection layer after the contact layer was formed by connecting the interconnection layer formed on the surface side in the pad portion.

Thus, it becomes possible to form the pad in the solid-state imaging device having the back-illuminated type structure too.

Therefore, according to the present invention, it becomes possible to realize the solid-state imaging device having the back-illuminated type structure. Also, it becomes possible to achieve an effective vignetting factor of 100% of slanting incident light by the back-illuminated type structure. Further, it becomes possible to considerably improve sensitivity and to realize the solid-state imaging device having the back-illuminated type structure which is free from the shading.

BRIEF DESCRIPTION OF THE DRAWINGS

FIGS. 3A to 3E are process diagrams used to explain a method of manufacturing a CMOS type solid-state imaging device having a back-illuminated type structure, respectively;

FIG. 4 is a schematic cross-sectional view showing an arrangement of a solid-state imaging device according to an embodiment of the present invention;

FIGS. 5A and 5B are schematic diagrams to which reference will be made in explaining the position of an alignment mark, respectively;

FIGS. 11A to 11C are process diagrams used to explain an example of a method of manufacturing a solid-state imaging device shown in FIG. 4, respectively;

FIGS. 12A to 12C are process diagrams used to explain an example of a method of manufacturing a solid-state imaging device shown in FIG. 4, respectively;

FIGS. 13A to 13C are process diagrams used to explain an example of a method of manufacturing a solid-state imaging device shown in FIG. 4, respectively;

FIGS. 14A to 14C are process diagrams used to explain an example of a method of manufacturing a solid-state imaging device shown in FIG. 4, respectively;

FIGS. 17A to 17C are process diagrams used to explain other example of a method of manufacturing a solid-state imaging device shown in FIG. 4, respectively;

FIGS. 18A to 18C are process diagrams used to explain other example of a method of manufacturing a solid-state imaging device shown in FIG. 4, respectively;

FIGS. 19A to 19C are process diagrams used to explain other example of a method of manufacturing a solid-state imaging device shown in FIG. 4, respectively;

FIGS. 20A to 20C are process diagrams used to explain other example of a method of manufacturing a solid-state imaging device shown in FIG. 4, respectively;

FIGS. 21A to 21C are process diagrams used to explain a further example of a method of manufacturing a solid-state imaging device shown in FIG. 4, respectively;

FIGS. 22A to 22C are process diagrams used to explain a further example of a method of manufacturing a solid-state imaging device shown in FIG. 4, respectively;

FIGS. 23A to 23C are process diagrams used to explain a further example of a method of manufacturing a solid-state imaging device shown in FIG. 4, respectively;

FIGS. 24A to 24C are process diagrams used to explain a further example of a method of manufacturing a solid-state imaging device shown in FIG. 4, respectively;

FIGS. 25A and 25B are process diagrams used to explain a further example of a method of manufacturing a solid-state imaging device shown in FIG. 4, respectively;

FIG. 26 is a schematic cross-sectional view showing an arrangement of a solid-state imaging device according to other embodiment of the present invention;

FIGS. 27A to 27C are process diagrams used to explain an example of a method of manufacturing a solid-state imaging device shown in FIG. 26, respectively;

FIG. 32 is a schematic cross-sectional view showing an arrangement of a solid-state imaging device according to a further embodiment of the present invention;

FIGS. 33A to 33C are process diagrams used to explain an example of a method of manufacturing a solid-state imaging device shown in FIG. 32, respectively;

DESCRIPTION OF THE PREFERRED EMBODIMENTS

Figure 1:
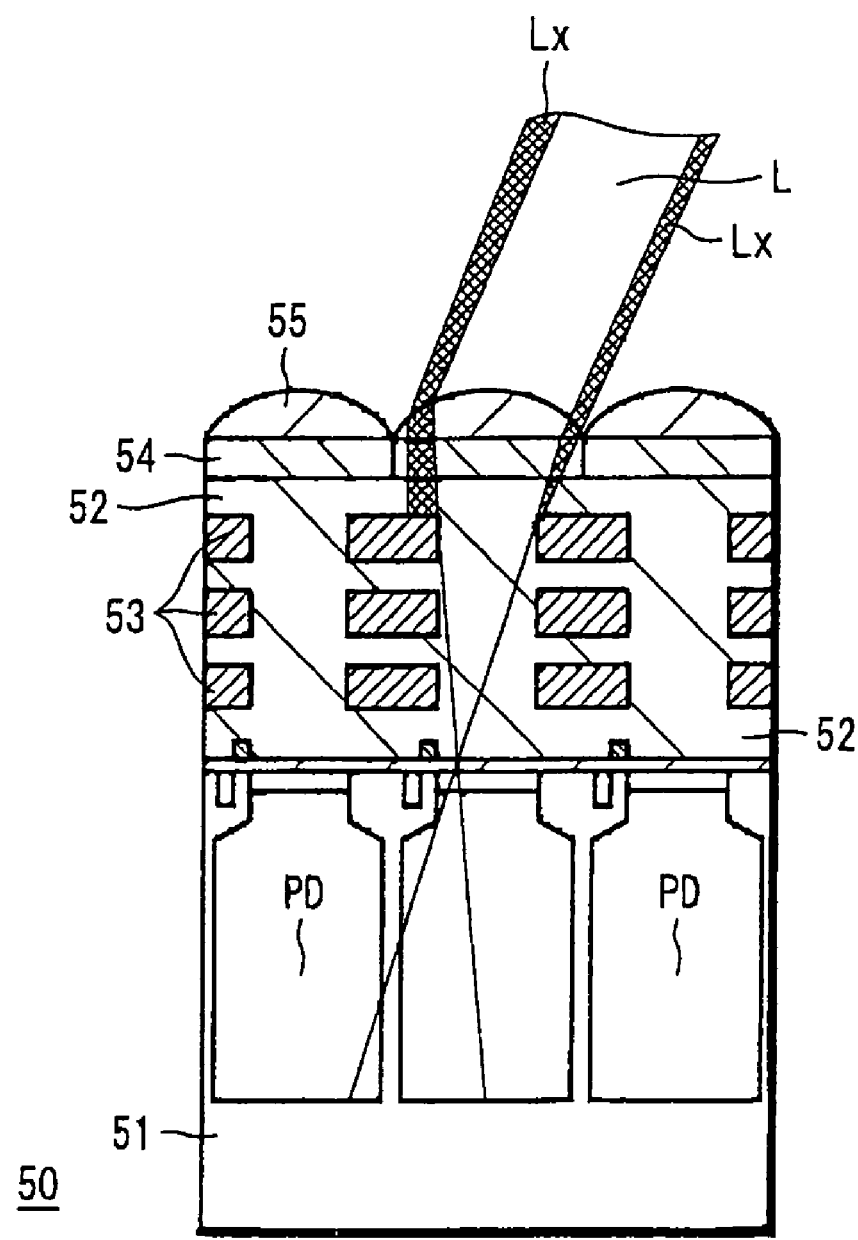
FIG. 1 is a cross-sectional view showing a CMOS type solid-state imaging device having a surface-illuminated type structure.
Figure 2:
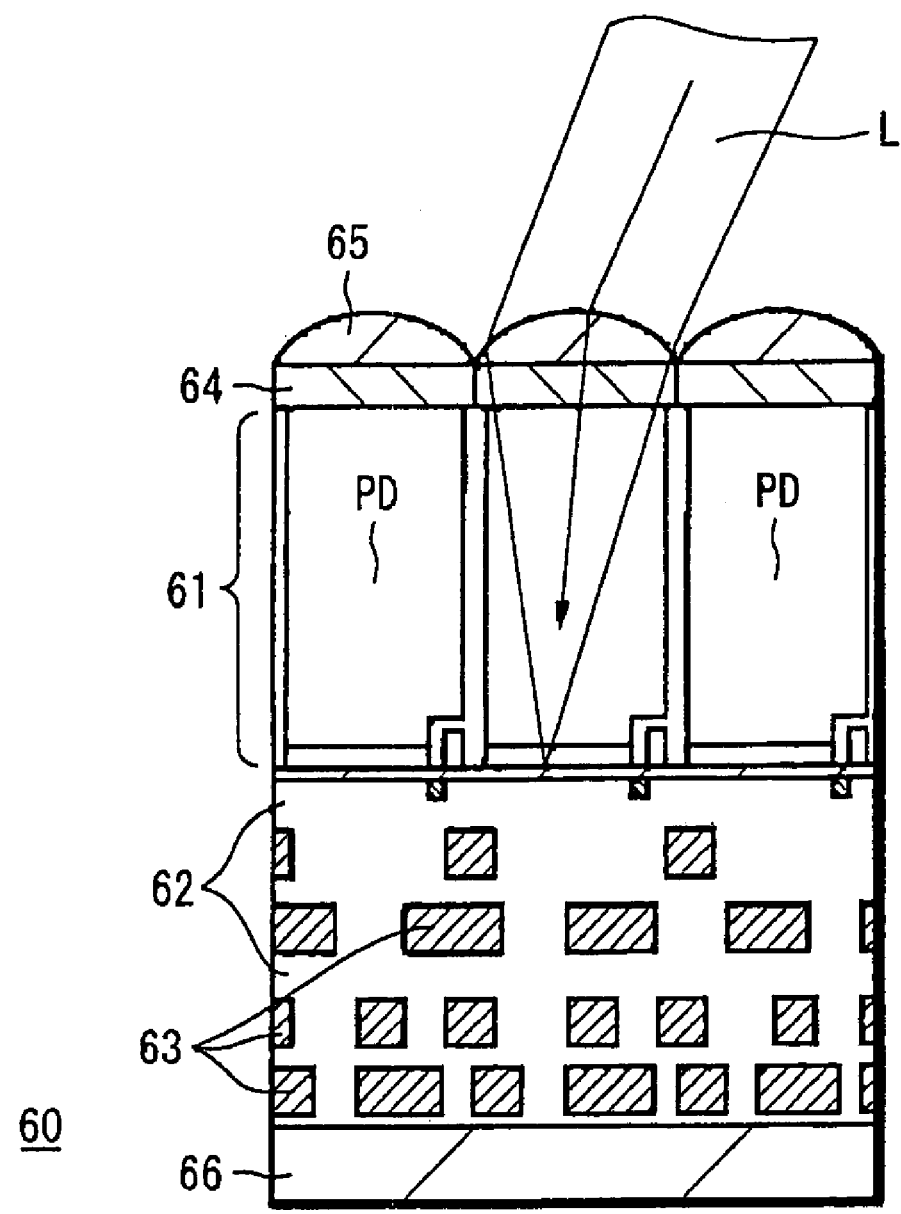
FIG. 2 is a cross-sectional view showing a CMOS type solid-state imaging device having a back-illuminated type structure.
Figures 3A, 3B, 3C:
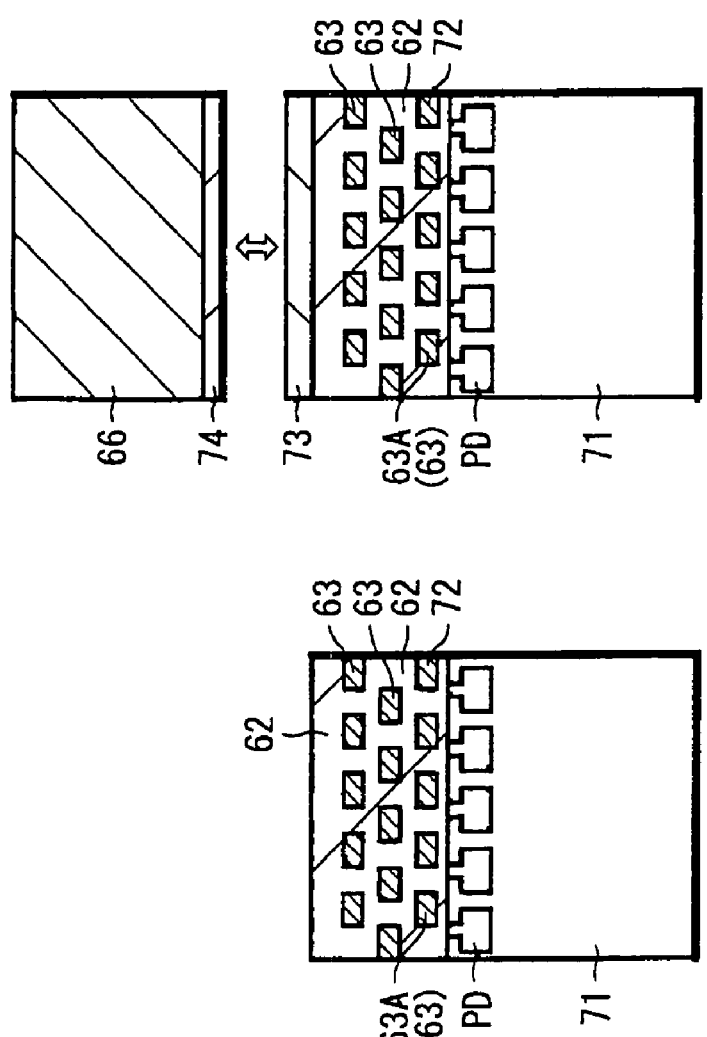

The present invention will now be described in detail with reference to the drawings.

FIG. 4 is a schematic diagram (cross-sectional view) showing an arrangement of a solid-state imaging device according to an embodiment of the present invention.

In this embodiment, the present invention is applied to a CMOS type solid-state imaging device having a back-illuminated type structure.

As shown in FIG. 4, a solid-state imaging device 1 includes a silicon layer 2 in which a photodiode PD serving as a light-receiving sensor portion is formed. A color filter 6 is formed on the silicon layer 2 through a planarized layer 5 and an on-chip lens 7 is formed on the color filter 6. Also, an interconnection portion in which interconnection layers 4 of a plurality of layers (three layers in FIG. 4) are formed within an insulating layer 3 is formed under the silicon layer 2. The interconnection portion is formed on a supporting substrate 8 and the whole of this solid-state imaging device is supported by this supporting substrate 8.

As shown in FIG. 4, the color filter 6 and the on-chip lens 7 are disposed on the opposite side of the surface side of the silicon layer 2 in which the light-receiving sensor portion (photodiode PD) is formed, that is, on the back side of the silicon layer 2, thereby forming the solid-state imaging device 1 having the back-illuminated type structure.

The insulating layer 3 of the interconnection portion and the supporting substrate 8 are bonded and fixed by adhesive layers 9, 10. When the supporting substrate 8 is formed of a silicon substrate, for example, the adhesive layers 9, 10 can be formed of $SiO_2$ films.

Further, as shown in FIG. 4, an insulating layer (for example, an $SiO_2$ layer) 13 serving as an alignment mark is formed around an image pickup region 20 such that it may be extended through the silicon layer 2 so as to partly overlap the upper portion of the insulating layer 3 formed under the silicon layer 2.

Outside the image pickup region 20, an electrode layer 15 formed on the surface is connected to an interconnection layer 11 formed of the same layer as that of the interconnection layer 4 of the uppermost layer through a contact layer 12 formed through the silicon layer 2 and the upper portion of the insulating layer 3 to thereby construct a pad portion. The contact layer 12 is insulated from the silicon layer 2 by an insulating layer (for example, $SiO_2$ layer) 14.

The insulating layer 13 serving as the alignment mark has a different reflectivity relative to the silicon layer 2 and hence it can be used as the alignment mark. For example, the position of the insulating layer 13 can be detected with illumination of light from above.

Also, the insulating layer 13 and the insulating layer 14 of the pad portion are composed of insulating layers of the same material formed at the same time.

When the solid-state imaging device 1 shown in FIG. 4 is manufactured, a large number of chips 101 of the solid-state imaging device 1 are formed within a wafer 100 as shown in a plan view of FIG. 5A.

FIG. 5B is a schematic plan view showing the wafer 100 shown in FIG. 5A in an enlarged-scale. As shown in FIG. 5B, the insulating layers 13 serving as the alignment marks of the predetermined number are located at the predetermined positions outside the image pickup region 20 in each chip 101.

The arrangement of the alignment marks on the plane is not limited to the arrangement shown in FIG. 5B and other arrangements of the alignment marks also are possible.

The solid-state imaging device 1 according to this embodiment can be manufactured as follows, for example.

Figure 6A:
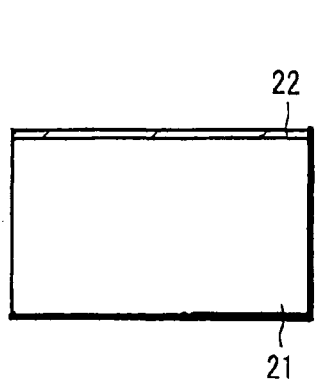
FIGS. 6A to 6C are process diagrams used to explain an example of a method of manufacturing a solid-state imaging device shown in FIG. 4, respectively.

First, as shown in FIG. 6A, a thin oxide film 22 is formed by oxidizing the surface of a silicon substrate 21.

Figures 6B, 6C:
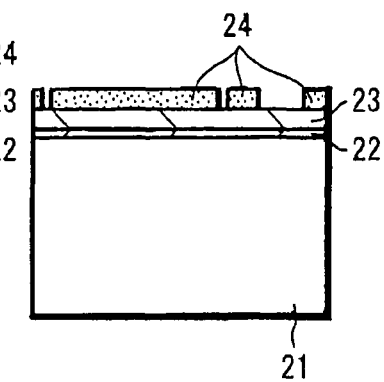

Next, as shown in FIG. 6B, an SiN film (silicon nitride layer) 23 and a photoresist 24 are deposited on the oxide film 22, in that order.

Next, as shown in FIG. 6C, a through-hole is formed by exposing and developing the photoresist 24.

Figure 7A:
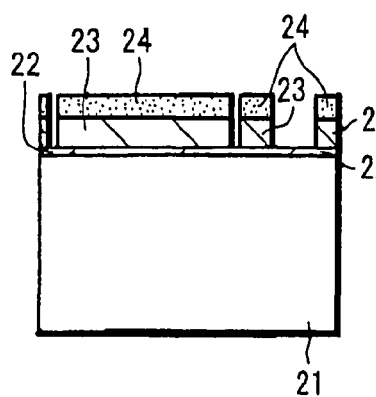
FIGS. 7A to 7C are process diagrams used to explain an example of a method of manufacturing a solid-state imaging device shown in FIG. 4, respectively.
Figure 7B:
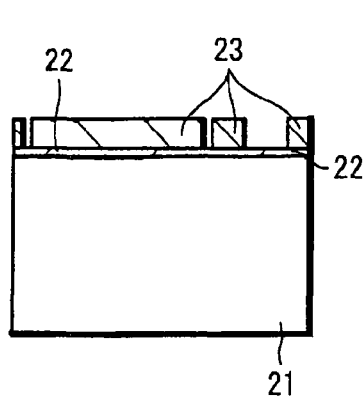

Next, as shown in FIG. 7A, the SiN film 23 is etched by using the photoresist 24 as a mask and thereby a through-hole is formed on the SiN film 23. Further, as shown in FIG. 7B, the SiN film 23 is left by removing the photoresist 24, thereby forming a hard mask (SiN film 23) for etching the silicon substrate 21.

Figure 7C:
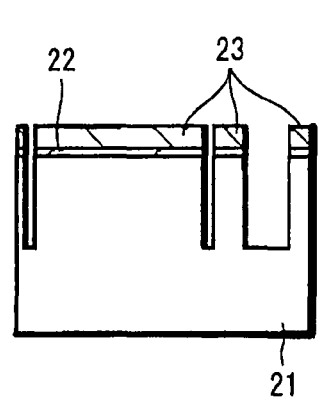

Next, as shown in FIG. 7C, an alignment mark groove and a pad contact hole having depths ranging from 5 to 20 μm are formed on the silicon substrate 21 by an RIE (reactive ion etching) method. The depths of the alignment mark groove and the pad contact hole are made corresponding to the depth of a photodiode PD which will be formed later on.

Figure 8A:
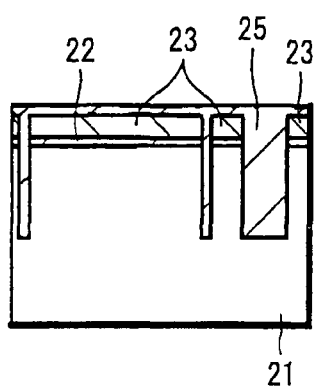
FIGS. 8A to 8C are process diagrams used to explain an example of a method of manufacturing a solid-state imaging device shown in FIG. 4, respectively.

Next, as shown in FIG. 8A, an insulating layer 25 made of $SiO_2$, for example, is deposited on the whole surface so as to fill the groove formed on the silicon substrate 21. The material of the insulating layer 25 to be filled may be a suitable material such as SiN and the insulating layer 25 may be made of any material so long as the material is an insulating material.

Figure 8B:
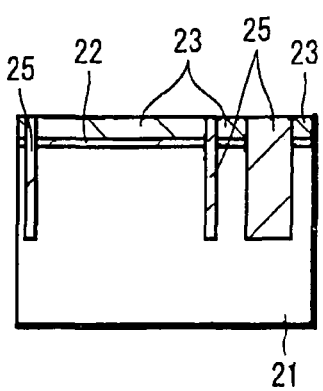

Next, the insulating layer 25 is removed from the surface by a CMP (chemical mechanical polish) method or an RIE method, whereby the insulating layer 25 is left only in the groove and the contact hole as shown in FIG. 8B.

Figure 8C:
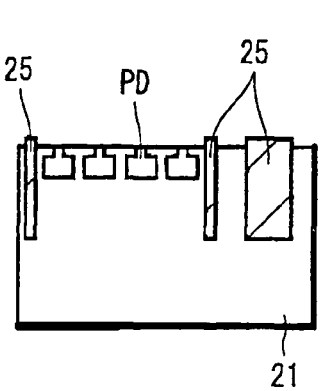

Subsequently, the SiN film 23 is removed and an impurity region comprising the photodiode PD of the light-receiving sensor portion is formed within the silicon layer 21 as shown in FIG. 8C. At that time, since the insulating layer 25 buried into the portion corresponding to the peripheral portion of the image pickup region 20 has a reflectivity different from that of the surrounding silicon layer 21 and the surface of the insulating layer 25 is protruded, the photodiode PD can be aligned by using this insulating layer 25.

Figures 9A, 9B, 9C:
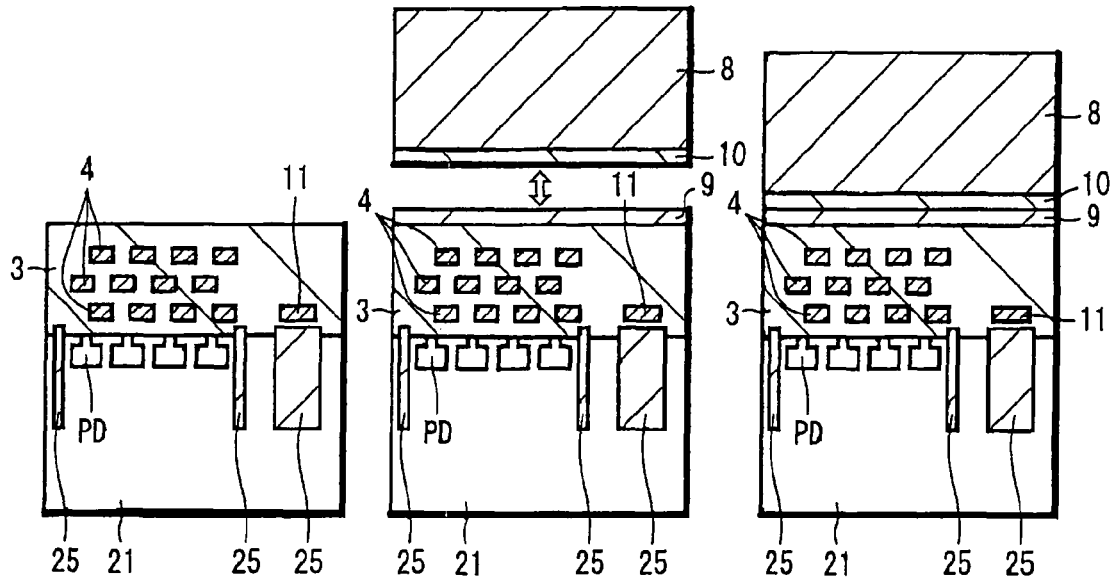
FIGS. 9A to 9C are process diagrams used to explain an example of a method of manufacturing a solid-state imaging device shown in FIG. 4, respectively.

Next, as shown in FIG. 9A, the interconnection layers 4 of multilayer are sequentially formed on the silicon substrate 21 through the insulating layer 4 and thereby an interconnection portion is formed.

After that, an $SiO_2$ film (adhesive layer) 9 is formed on the surface of the insulating layer 3 and the surface of the insulating layer 3 is planarized and polished. At the same time, a supporting substrate 8 with a T-SiO$_2$ film (adhesive layer) 9 formed on the surface thereof is prepared and the insulating layer 3 of the interconnection portion and the supporting substrate 8 are bonded together as shown in FIGS. 9B and 9C in such a manner that the SiO$_2$ films 9, 10 may be opposed to each other as shown in FIG. 9B.

Figures 10A, 10B, 10C:
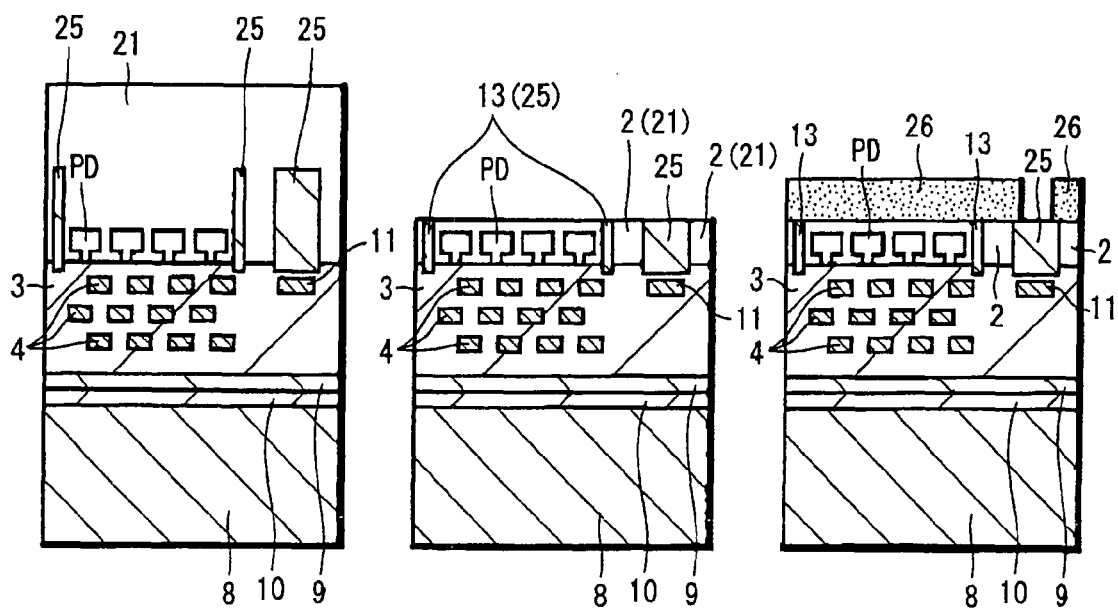
FIGS. 10A to 10C are process diagrams used to explain an example of a method of manufacturing a solid-state imaging device shown in FIG. 4, respectively.

Next, the wafer is inverted as shown in FIG. 10A.

Next, the silicon substrate 21 that is the wafer rear material is decreased in thickness by the CMP method, the RIE method or a BGR (background) method or a combination of these three methods such that at least the insulating layers 25 formed within the previously-formed groove and the contact hole may be exposed as shown in FIG. 10B. As a consequence, the silicon layer 2 is formed from the silicon substrate 21 and the insulating layer 13 of the alignment mark is formed from the insulating layer 25. Also, the insulating layer 25 of the pad portion is formed as the insulating layer 14 around the contact layer 12.

If the depth of the groove formed on the silicon substrate 21 is set in response to the thickness of the final silicon layer 2, then it becomes possible to use the insulating layer 25 buried into the groove as the layer to detect the end required when the silicon substrate 21 is decreased in thickness.

Subsequently, the contact of the pad portion is formed.

First, a photoresist 26 is formed on the surface and the photoresist 26 is exposed and developed and thereby formed as a mask having a through-hole at the pad portion as shown in FIG. 10C. At that time, the size of the through-hole is made smaller than the insulating layer 25 of the pad portion.

Next, as shown in FIG. 11A, the insulating layer 25 of the pad portion and the insulating layer 3 on the interconnection layer 11 of the pad portion are etched by using the photoresist 26 as the mask, thereby forming a contact hole which reaches the interconnection layer 11 through these insulating layers 25, 3. At that time, since the opening of the photoresist 26 is smaller than the insulating layer 25 of the pad portion, the insulating layer 25 is left around the contact hole, thereby forming the insulating layer 14 shown in FIG. 4.

After that, the photoresist 26 is removed as shown in FIG. 11B.

Next, as shown in FIG. 1C, a metal layer 27 serving as a material of a contact layer, for example, a W (tungsten) layer is formed on the whole surface so as to bury the contact hole.

While W (tungsten) is used as the material that fills the contact hole as described above, the present invention is not limited thereto and Al or Cu or Ag or Au of alloy thereof may be used as the material for filling the contact hole. Also, when the metal layer 27 is filled into the contact hole, a barrier metal film may be formed on the underlayer in advance according to the need.

Next, as shown in FIG. 12A, a metal layer 27 is removed from the surface by the CMP method or the RIE method. As a result, the metal layer 27 is left only within the contact hole to serve as a contact layer 12.

Next, as shown in FIG. 12B, a planarized layer 5 made of SiO$_2$, for example, is deposited on the surface.

Next, as shown in FIG. 12C, a photoresist 28 is formed on the planarized layer 5. Further, the photoresist 28 is removed from only the pad portion by exposing and developing the photoresist 28 as shown in FIG. 13A.

Next, as shown in FIG. 13B, while the photoresist 28 is being used as the mask, only the pad portion is removed by etching the planarized layer 5, whereby the contact layer 12 is exposed.

Subsequently, as shown in FIG. 13C, the photoresist 28 is removed.

Next, as shown in FIG. 14A, an electrode layer 15 made of Al, for example, is deposited on the whole surface.

Next, as shown in FIG. 14B, a photoresist 29 is formed on the surface. Further, the photoresist 29 is left in only the pad portion by exposing and developing the photoresist 29 as shown in FIG. 14C.

Figure 15A:
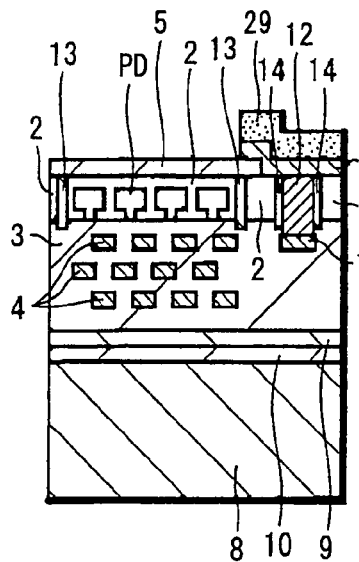
FIGS. 15A to 15C are process diagrams used to explain an example of a method of manufacturing a solid-state imaging device shown in FIG. 4, respectively.
Figure 15B:
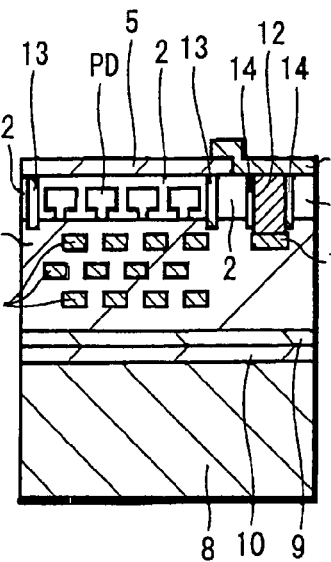

Next, as shown in FIG. 15A, while the photoresist 29 is being used as a mask, the electrode 15 is left in only the pad portion by etching the electrode layer 15. Subsequently, the photoresist 29 is removed as shown in FIG. 15B.

Figure 15C:
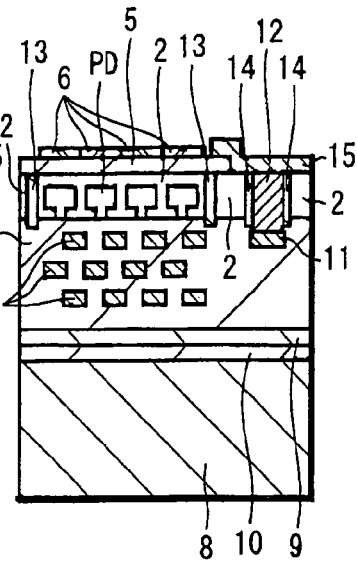

Next, as shown in FIG. 15C, a color filter 6 is formed on the planarized layer 5 formed above the photodiode PD of the image pickup region by a well-known method.

Figure 16A:
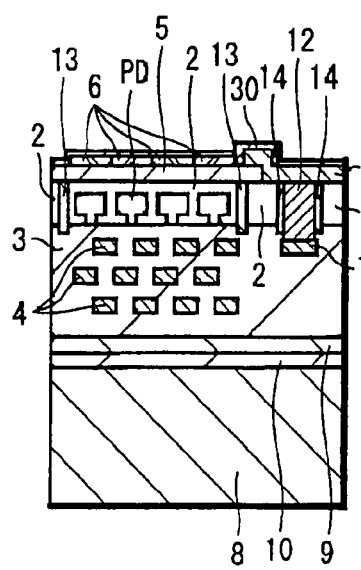
FIGS. 16A and 16B are process diagrams used to explain an example of a method of manufacturing a solid-state imaging device shown in FIG. 4, respectively.

Subsequently, as shown in FIG. 16A, a coating film 30 is formed by coating a material serving as an on-chip lens on the color filter 6.

Figure 16B:
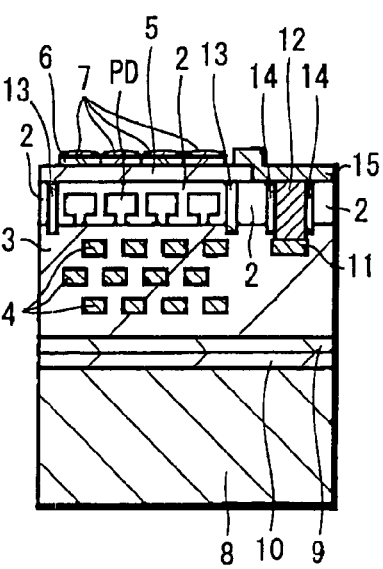

Finally, an on-chip lens 7 whose surface is shaped as a curved surface is produced from the coating film 30 by a well-known method as shown in FIG. 16B. In this manner, the solid-state imaging device 1 shown in FIG. 4 can be manufactured.

At that time, since the alignment mark is formed around the photodiode PD by the insulating layer 13, the photodiode PD and the on-chip lens 7 can be formed without positional displacement.

While the on-chip lens 7 is formed after the electrode layer 15 was formed in the above-mentioned manufacturing process, the electrode layer 15 may be formed after the on-chip lens 7 was formed.

A manufacturing process in that case will be described next.

The manufacturing processes shown in FIGS. 6A to 12B are similar to those of the manufacturing process of this case.

After the manufacturing process shown in FIG. 12B, the color filter 6 is formed on the planarized layer 5 formed above the photodiode PD as shown in FIG. 17A.

Subsequently, as shown in FIG. 17B, the coating film 30 is formed by coating the material serving as the on-chip lens on the color filter 6.

Next, the on-chip lens 7 whose surface is shaped as the curved surface is produced from the coating film 30 as shown in FIG. 17C.

At that time, since the alignment mark is formed around the photodiode PD by the insulating layer 13, the photodiode PD and the on-chip lens 7 can be formed without positional displacement.

Next, as shown in FIG. 18A, a photoresist 31 is formed on the whole surface. Further, the photoresist 31 is removed from only the pad portion by exposing and developing the photoresist 31.

Next, as shown in FIG. 18C, while the photoresist 31 is being used as the mask, only the pad portion is removed by etching the planarized layer 5. Subsequently, the photoresist 31 is removed as shown in FIG. 19A.

Next, as shown in FIG. 19B, the electrode layer 15 is deposited on the whole surface.

Next, as shown in FIG. 19C, the photoresist 32 is formed on the surface. Further, the photoresist 32 is left in only the pad portion by exposing and developing the photoresist 32 as shown in FIG. 20A.

Next, as shown in FIG. 20B, while the photoresist 32 is being used as the mask, the electrode layer 15 is left only in the pad portion by etching the electrode layer 15. Subsequently, the photoresist 32 is removed as shown in FIG. 20C.

In this manner, the solid-state imaging device 1 shown in FIG. 4 can be manufactured.

According to the above-mentioned manufacturing process, the photodiode PD and the on-chip lens 7 can be formed without positional displacement by using the insulating layer as the alignment mark. Also, the pad portion can be formed by the electrode layer 15 and hence the CMOS type solid-state imaging device with the back-illuminated type structure can be manufactured.

Further, while the solid-state imaging device 1 is manufactured from the silicon substrate 21 in any one of the above-mentioned respective manufacturing processes, the present invention is not limited thereto and a solid-state imaging device may be formed from an SOI (silicon-on-insulator) substrate. A manufacturing process in that case will be described next.

First, there is prepared an SOI substrate 36 comprising a silicon substrate 33, an SiO$_2$ film (silicon oxide film) 34 and a silicon layer 35. As shown in FIG. 21A, a thin oxide film 22 is formed by oxidizing the upper surface of the silicon layer 35 of this SOI substrate 36.

Next, as shown in FIG. 21B, an SiN film 23 and a photoresist 24 are deposited on the oxide film 22, in that order.

Next, as shown in FIG. 21C, a through-hole is formed by exposing and developing the photoresist 24.

Next, as shown in FIG. 22A, while the photoresist 24 is being used as a mask, a through-hole is formed on the SiN film 23 by etching. Further, as shown in FIG. 22B, the SiN film 23 is left by removing the photoresist 24, whereby a hard mask (SiN film 23) for etching the silicon layer 35 is formed.

Next, as shown in FIG. 22C, an alignment mark groove and a pad contact hole (having depths ranging from approximately 5 to 20 μm) are formed on the silicon layer 35 by the RIE method, thereby forming a contact hole which reaches the SiO$_2$ film 34. A film thickness of the silicon layer 35 is selected in advance in such a manner that the depth of the contact hole formed at that time may correspond to the depth of the photodiode PD which will be formed later on.

Next, as shown in FIG. 23A, an insulating layer 25 made of SiO$_2$, for example, is formed on the whole surface so as to fill the groove formed on the silicon layer 35. A material of the insulating layer 25 to be filled may be a suitable material such as SiN and any material can be used so long as the material is the insulating material.

Next, as shown in FIG. 23B, the insulating layer 25 is removed from the surface by the CMP method or the RIE method, whereby the insulating layer 25 is left within only the groove and the contact hole.

Next, after the SiN film 23 was removed, as shown in FIG. 23C, an impurity region comprising the photodiode PD of the light-receiving sensor portion is formed within the silicon layer 35. At that time, the insulating layer 25 buried into the portion corresponding to the peripheral portion of the image pickup region 20 has a reflectivity different from that of the surrounding silicon layer 21 and the surface of this insulating layer 25 is protruded, the photodiode PD can be properly aligned by using this insulating layer 25.

Then, as shown in FIG. 24A, the interconnection layers 4 of multilayer are deposited on the silicon layer 35 through the insulating layer 3 sequentially, thereby forming an interconnection portion.

After that, the SiO$_2$ film (adhesive layer) 9 is formed on the surface of the insulating layer 3 and the surface thereof is planarized and polished. At the same time, the supporting substrate 8 with the T-SiO$_2$ film (adhesive layer) formed on its surface is prepared, and the insulating layer 3 of the interconnection portion and the supporting substrate 8 are bonded together as shown in FIG. 24C in such a manner that the SiO$_2$ films 9, 10 may be opposed to each other as shown in FIG. 24B.

Next, as shown in FIG. 25A, the wafer is inverted up and down.

Next, the silicon layer 35 and the insulating layer 25 within the previously-formed groove and contact hole are exposed by removing the silicon layer 35, the SiO$_2$ film (silicon oxide film) 34 serving as the back material of the wafer in accordance with the CMP method, RIE method, the BGR method or the combination of these three methods. As a result, the insulating layer 13 of the alignment mark is formed from the insulating layer 25. Also, the insulating layer 25 of the pad portion becomes the insulating layer 14 formed around the contact layer.

After that, through the processes shown in FIGS. 10C to 16B, the solid-state imaging device 1 shown in FIG. 4 can be manufactured.

According to the above-mentioned solid-state imaging device 1 of this embodiment, since the insulating layer 13 is buried around the image pickup region 20 through the silicon layer 2, when the solid-state imaging device 1 is manufactured, it becomes possible to align the photodiode PD of the light-receiving sensor portion and the on-chip lens 7 by using this insulating layer 13 as the alignment mark (that is, mark for use as alignment). Thus, it becomes possible to accurately form the on-chip lens 7 at the predetermined position in alignment with the photodiode PD.

Also, in the pad portion, the contact layer 12 is formed within the insulating layer 14 buried into the silicon layer 2 while it is being connected to the interconnection layer 11 on the surface side of the silicon layer 2, and the electrode layer 15 formed on the surface and the interconnection layer 11 are connected through this contact layer 12. As a result, the insulating layer 14 insulates the silicon layer 2 and the contact layer 12 and the pad portion is constructed by the electrode layer 15.

Then, if the photodiode PD of the light-receiving sensor portion is formed after the insulating layer 13 was buried into the silicon layer 2, then the photodiode PD can be accurately formed at the predetermined position by using the insulating layer 13 as the alignment mark.

Also, if the contact hole is formed within the insulating layer 14 after the insulating layer 14 was buried into the silicon layer 2 of the pad portion and the conductive material is buried into this contact hole so as to be connected to the interconnection layer 1, then the contact layer 12 for connecting the interconnection layer 11 and the electrode layer 15 can be formed and the silicon layer 2 and the contact layer 12 can be insulated from each other by the insulating layer 14.

Therefore, according to this embodiment, since it becomes possible to form the alignment mark for aligning the photodiode PD of the light-receiving sensor portion and the on-chip lens 7 and the pad portion, it becomes possible to realize the solid-state imaging device with the back-illuminated type structure.

Thus, it becomes possible to achieve the effective vignetting factor of 100% of slanting incident light by the back-illuminated type structure and sensitivity can be improved considerably. Therefore, it becomes possible to realize the solid-state imaging device which is free from the shading.

FIG. 26 is a schematic diagram (cross-sectional view) showing an arrangement of a solid-state imaging device according to other embodiment of the present invention.

As shown in FIG. 26, in particular, around the image pickup region 20, a second silicon layer (for example, amorphous silicon layer or polycrystalline silicon layer) 17 is buried into the first silicon layer (single crystal silicon layer) 2 in which the photodiode PD is formed. Further, a metal layer 16 is formed on an insulating layer 19 on this second silicon layer 17.

Further, also in the pad portion, a second silicon layer 18 is buried instead of the insulating layer 14 shown in FIG. 4. Then, an insulating layer 19 is deposited between the contact layer 12 and the second silicon layer 18 in order to insulate the contact layer 12 for connecting the interconnection layer 11 and the electrode layer 15 and the buried second silicon layer 18.

While the insulating layer 19 can be made of the same insulating material as that of the planarized layer 5 shown in FIG. 4, the insulating layer 19 is formed by a method different from that of the planarized layer 5.

In this case, since the metal layer 16 and the insulating layer 19 are different from each other in reflectivity of light, the metal layer 16 is used as the alignment mark which can align the photodiode PD and the on-chip lens 7.

A rest of arrangement is similar to that of the solid-state imaging device according to the preceding embodiment. Hence, identical elements and parts are denoted by the identical reference numerals and therefore need not be described in detail.

A solid-state imaging device according to this embodiment can be manufactured as follows, for example.

A process flowchart required before the contact hole of the pad portion is formed is similar to that for manufacturing the solid-state imaging device 1 according to the preceding embodiment and differs only in that the insulating layers 13, 14 are changed to the second silicon layers 17, 18. Although not shown, when the photodiode PD is manufactured, since the surface of the second silicon layer 17 buried around the image pickup region 20 is protruded, it is possible to align the photodiode PD by using this second silicon layer 17.

Let us start describing the manufacturing process for manufacturing the solid-state imaging device 110 in the state in which the contact hole of the pad portion is formed, which corresponds to the state shown in FIG. 11B.

As shown in FIG. 27A, around the image pickup region 20 (see FIG. 26), the second silicon layer 17 is buried into the first silicon layer 2 in which the photodiode PD is formed, and an insulating layer 37 is deposited on the whole surface so as to fill the contact hole from the state in which the second silicon layer 18 is buried around the contact hole.

Next, as shown in FIG. 27B, a photoresist 38 is formed on the surface. Further, as shown in FIG. 27C, a through-hole is formed on a photoresist 38 by exposing and developing the photoresist 38. At that time, a through-hole is formed on the alignment mark portion.

Figures 28A, 28B, 28C:
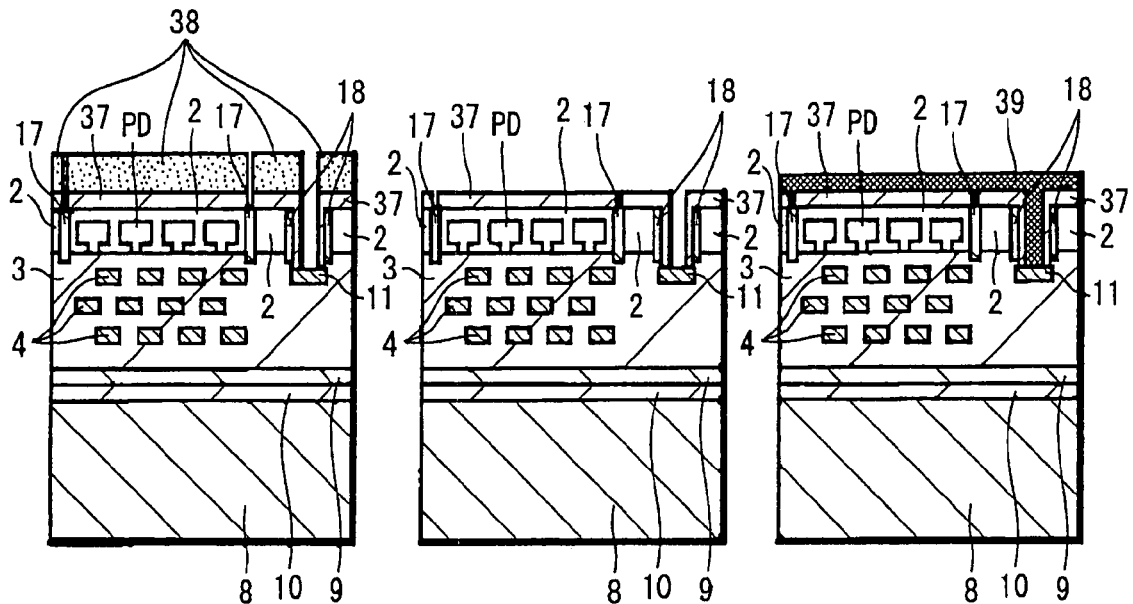
FIGS. 28A to 28C are process diagrams used to explain an example of a method of manufacturing a solid-state imaging device shown in FIG. 26, respectively.

Next, as shown in FIG. 28A, the insulating layer 37 is etched by using the photoresist 38 as the mask, whereby a groove which reaches the interconnection layer is formed on the pad portion and a groove is also formed on the alignment mark portion. Thereafter, the photoresist 38 is removed as shown in FIG. 28B.

Next, as shown in FIG. 28C, a metal layer 39 made of a suitable material such as W (tungsten) is formed on the whole surface so as to fill the through-hole of the pad portion and the groove of the alignment mark portion. When the metal layer 39 is filled into the contact hole, a barrier metal film may be formed on the underlayer in advance according to the need.

Figures 29A, 29B:
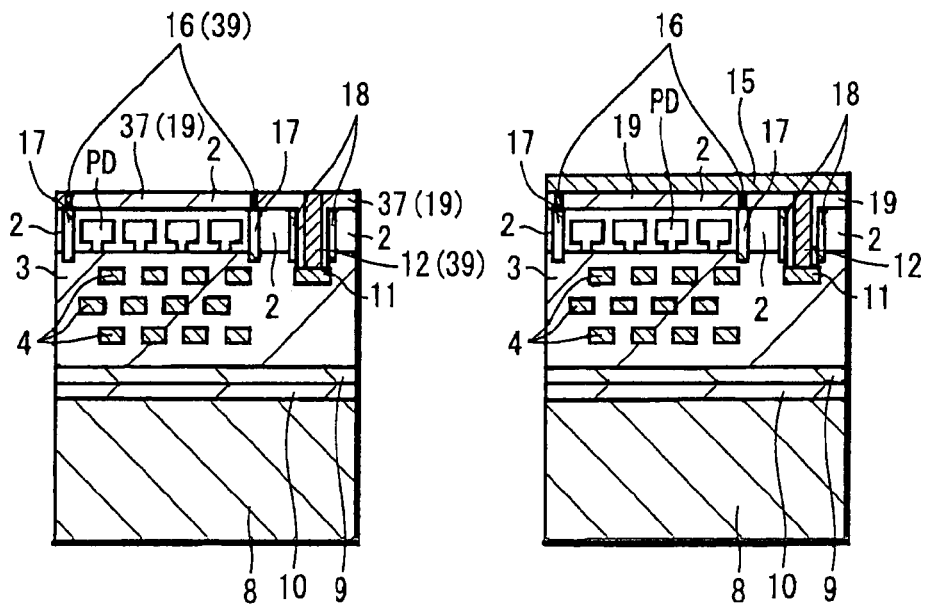
FIGS. 29A and 29B are process diagrams used to explain an example of a method of manufacturing a solid-state imaging device shown in FIG. 26, respectively.

Then, as shown in FIG. 29A, the metal layer 39 is removed from the surface, whereby the metal layer 39 is left in only the through-hole of the pad portion and in the groove of the alignment mark portion. The metal layer 39 within the groove of the pad portion becomes the contact layer 12 and the metal layer 39 within the groove of the alignment mark portion becomes the metal layer 16 of the alignment mark. The contact layer 12 and the second silicon layer 12 are insulated from each other by an insulating layer 37 (which becomes the insulating layer 19 shown in FIG. 4) buried between the contact layer 12 and the second silicon layer 18.

Next, as shown in FIG. 29B, the electrode layer 15 is deposited on the surface.

After that, through the processes similar to those shown in FIGS. 14B to 16B, the solid-state imaging device 110 shown in FIG. 26 can be manufactured.

According to the above-mentioned manufacturing process, the photodiode PD and the on-chip lens 7 can be formed without positional displacement by using the metal layer 16 as the alignment mark. Also, it becomes possible to form the pad portion by the electrode layer 15 and the CMOS type solid-state imaging device with the back-illuminated type structure can be manufactured.

While the silicon substrate 21 is used in the above-mentioned manufacturing method, it is possible to manufacture the solid-state imaging device 110 shown in FIG. 26 by using the SOI substrate shown in FIG. 21A. Also in that case, the fundamental process flow will not be changed. The silicon layer 35 of the SOI substrate 36 becomes the first silicon layer 2 according to this embodiment.

Further, according to this embodiment, the second silicon layers 17, 18 are filled into the grooves, the filling material, which is not only the nitride film but the oxide film, has an etching selection property and hence it becomes possible to use the oxide film instead of the SiN film 23 shown in FIGS. 6B to 8B.

According to the solid-state imaging device 110 of this embodiment, since the second silicon layer 17 is formed around the image pickup region 20 through the first silicon layer 2 and the metal layer 16 is formed on the second silicon layer 17, when the solid-state imaging device 110 is manufactured, it becomes possible to align the photodiode PD of the light-receiving sensor portion and the on-chip lens 7 by using this metal layer 16 as the alignment mark (that is, mark for alignment). As a result, it becomes possible to accurately form the on-chip lens 7 at the predetermined position in alignment with the photodiode PD.

Also, in the pad portion, the contact layer 12 is formed within the second silicon layer 18 buried in to the first silicon layer 2 through the insulating layer 19 so as to be connected to the interconnection layer 11 on the surface side of the first silicon layer 2 and the electrode layer 15 formed on the surface and the interconnection layer 11 are connected. Thus, the second silicon layer 18 and the contact layer 12 are insulated from each other by the insulating layer 19 and the pad portion is constructed by the electrode layer 15.

Then, if the photodiode PD of the light-receiving sensor portion is formed after the second silicon layer 17 was buried into the first silicon layer 2, then the photodiode PD can be accurately formed at the predetermined position by using the second silicon layer 17 as the alignment mark.

Also, after the second silicon layer 18 was buried into the first silicon layer 2 of the pad portion, the insulating layer 19 is buried into the second silicon layer 18, the contact hole is formed within this insulating layer 19 and the conductive material is buried into the contact hole and connected to the interconnection layer 11, whereby the contact layer 12 for connecting the interconnection layer 11 and the electrode layer 15 can be formed and the second silicon layer 18 and the contact layer 12 can be insulated by the insulating layer 19.

Therefore, according to this embodiment, in the solid-state imaging device with the back-illuminated type structure, since it becomes possible to form the alignment mark for aligning the photodiode PD of the light-receiving sensor portion and the on-chip lens 7 and the pad portion, it becomes possible to realize the solid-state imaging device with the back-illuminated type structure.

As a consequence, it becomes possible to achieve 100% of effective vignetting factor of slanting incident light by the back-illuminated type structure. Hence, sensitivity can be improved considerably and it becomes possible to realize the solid-state imaging device which is free from the shading.

While the groove for the alignment mark and the contact hole of the pad portion are formed simultaneously as shown in FIG. 17C in the manufacturing processes shown in FIGS. 6A to 16B, the groove for the alignment mark and the contact hole of the pad portion can be formed separately.

The manufacturing process in which the groove for the alignment mark and the contact hole of the pad portion are formed separately will be described below.

Figure 30A:
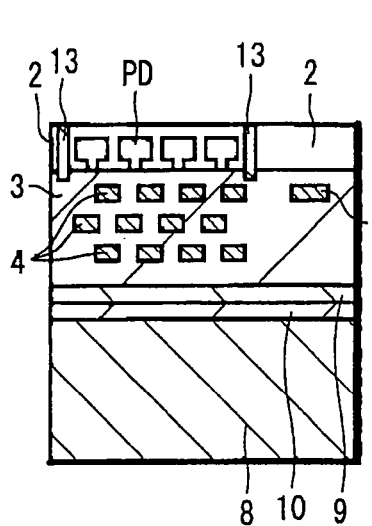
FIGS. 30A to 30C are process diagrams used to explain yet a further example of a solid-state imaging device shown in FIG. 4, respectively.

In this case, since the alignment mark is formed first and the contact hole of the pad portion is formed later on, in the same stage shown in FIG. 10B, the insulating layer 25 of the contact hole is not provided as shown in FIG. 30A and a rest of the arrangement is the same as that shown in FIG. 10B.

Figure 30B:
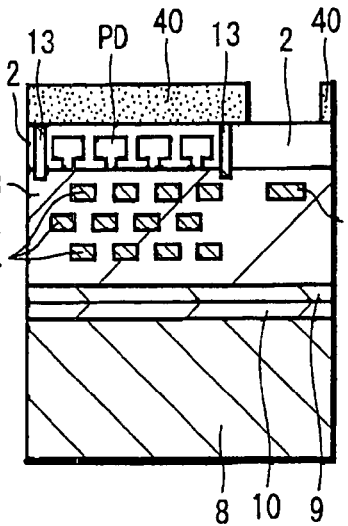

Subsequently, a photoresist 40 is formed on the surface, and a through-hole is formed on the photoresist 40 of the pad portion by exposing and developing the photoresist 40 as shown in FIG. 30B.

Figure 30C:
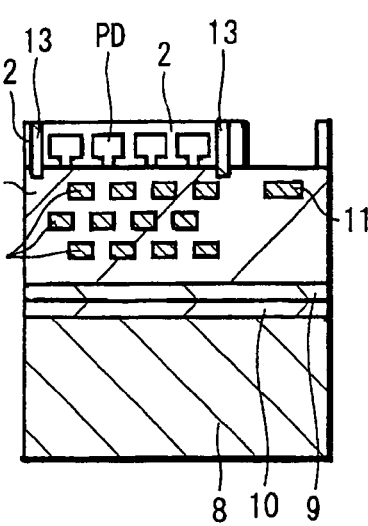

Next, while the photoresist 40 is being used as a mask, a recess portion (contact hole) that reaches the insulating layer 3 of the interconnection portion is formed by etching the silicon layer 2. After that, the photoresist 40 is removed as shown in FIG. 30C.

Figure 31A:
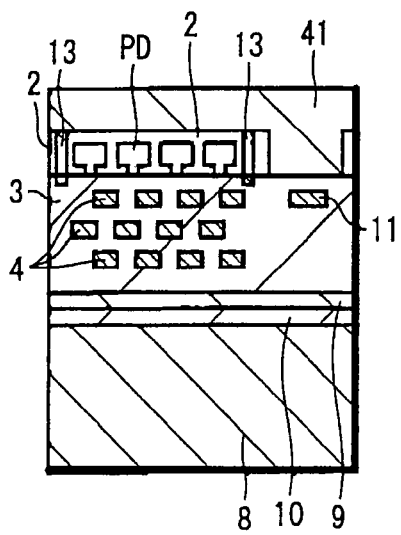
FIGS. 31A and 31B are process diagrams used to explain yet a further example of a solid-state imaging device shown in FIG. 4, respectively.
Figure 31B:
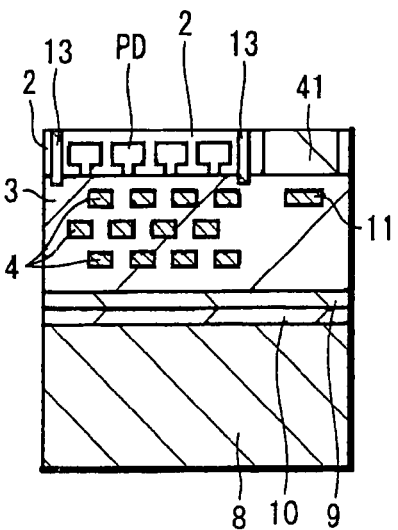

Next, as shown in FIG. 31B, an $SiO_2$ layer 41 is deposited on the whole surface so as to fill the recess portion.

Thereafter, as shown in FIG. 31B, the $SiO_2$ layer 41 is removed from the surface by the CMP method or the RIE method. As a result, the $SiO_2$ layer 41 is left in only the recess portion, and this state becomes substantially the same as shown in FIG. 10B.

When the groove of the alignment mark and the contact hole of the pad portion are formed separately as described above, there is an advantage in which the materials buried into the groove for the alignment mark and the contact hole can be made different so that optimum materials can be selected.

Further, when the solid-state imaging device 110 shown in FIG. 26 is manufactured, the process for forming the groove in the first silicon layer and the process for burying the second silicon layer into the groove can be executed around the image pickup region and at the pad portion either simultaneously or separately. Further, the photodiode PD can be formed after the second silicon layer was buried around the image pickup region, whereafter the second silicon layer can be buried into the pad portion.

FIG. 32 is a schematic diagram (cross-sectional view) showing an arrangement of a solid-state imaging device according to a further embodiment of the present invention. In this embodiment, the solid-state imaging device has an arrangement in which a contact layer of a pad portion and an electrode layer are formed of dual damascene.

As shown in FIG. 32, an electrode layer 15 having a T-like cross-section is formed so as to be connected to an interconnection layer 11, in particular, in the pad portion. The electrode layer 15 is composed of a horizontal-direction portion 15A serving as a pad and an vertical-direction portion 15B that corresponds to the contact layer. A planarized layer 5 has a through-hole above the electrode layer 15. Also, an insulating layer 14 is formed to be wide as compared with that of the solid-state imaging device 1 shown in FIG. 4.

A rest of arrangement is similar to that of the solid-state imaging device shown in FIG. 4. Hence, identical elements and parts are denoted by the identical reference numerals and need not be described in detail.

The solid-state imaging device 120 according to this embodiment can be manufactured as follows.

FIG. 33A shows the same state as that of FIG. 10C. Also in this case, although the solid-state imaging device 120 is manufactured through the processes similar to those shown in FIGS. 6A to 10C, since an insulating layer 25 within a groove (first groove) formed on the pad portion has a pad portion formed in the inside thereof, it is formed to be sufficiently larger than a through-hole of a resist mask 26 for forming a contact.

Next, as shown in FIG. 33B, while the photoresist 26 is being used as a mask, a contact hole (second groove) which reaches a pad interconnection layer 11 through these insulating layers 25, 3 is formed by etching the insulating layer 25 of the pad portion and the insulating layer 3 on the interconnection layer 11 of the pad portion according to the RIE method. At that time, since the through-hole of the photoresist 26 is sufficiently smaller than the insulating layer 25 of the pad portion, the insulating layer 25 is left around the contact hole.

Subsequently, as shown in FIG. 33C, the photoresist 26 is removed.

Figures 34A, 34B, 34C:
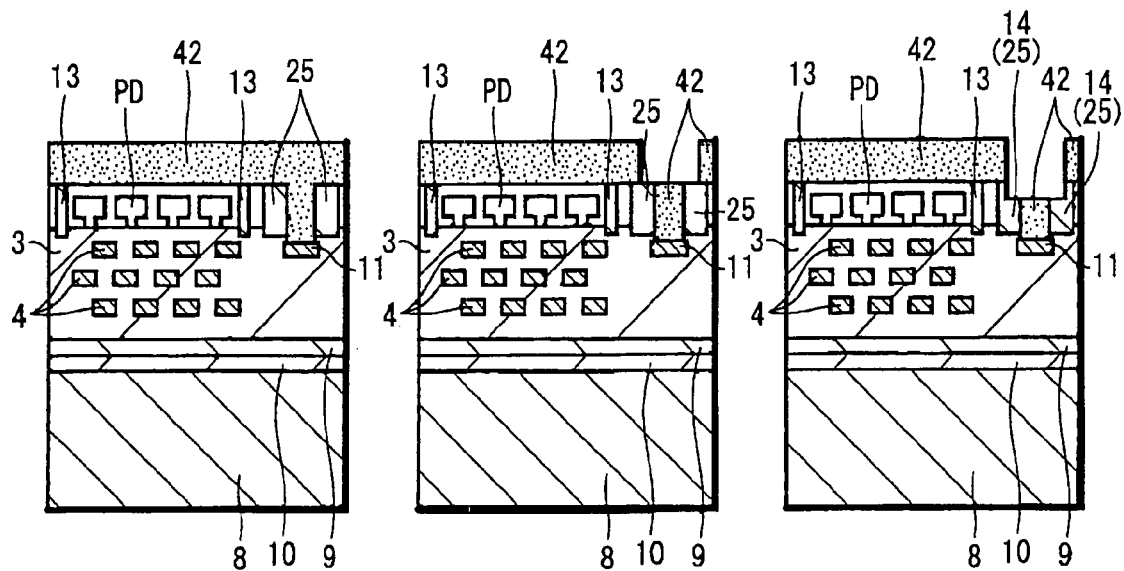
FIGS. 34A to 34C are process diagrams used to explain an example of a method of manufacturing a solid-state imaging device shown in FIG. 32, respectively.

Next, as shown in FIG. 34A, a photoresist 42 is formed on the whole surface so as to fill the contact hole (second groove). Then, a through-hole is formed on a photoresist 42 of a pad portion by exposing and developing the photoresist 42 as shown in FIG. 34B. At that time, the size of the through-hole is larger than the contact hole (second groove) and is also smaller than the insulating layer 25.

Next, as shown in FIG. 34C, the insulating layer 25 is partly etched by using the photoresist 42 as a mask. At that time, part of the photoresist 42 within the contact hole also is removed, whereby a groove (third groove) for use with a pad and which is narrower than the contact hole (second groove) is formed.

Figures 35A, 35B, 35C:
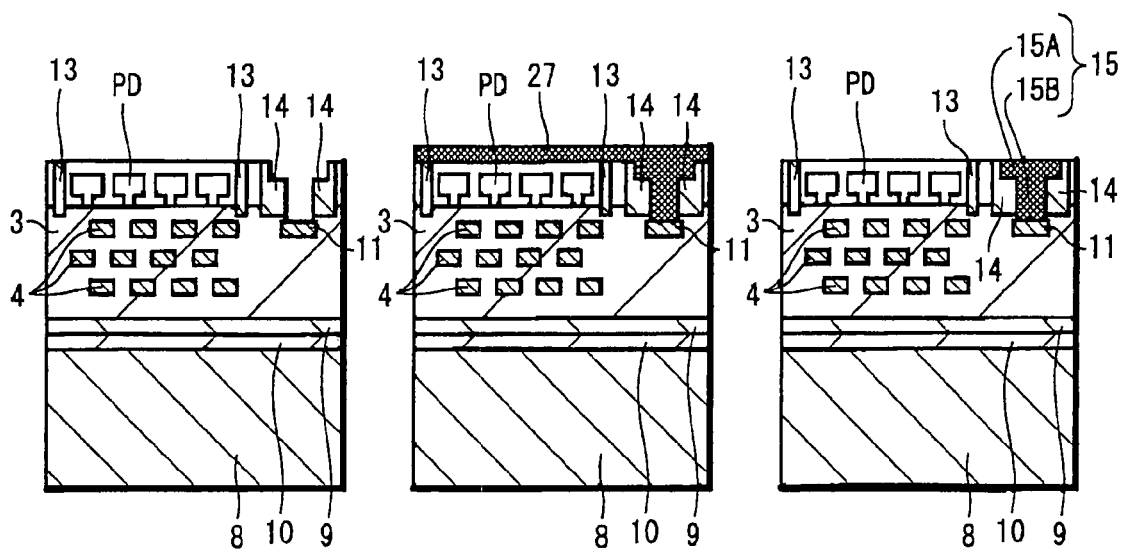
FIGS. 35A to 35C are process diagrams used to explain an example of a method of manufacturing a solid-state imaging device shown in FIG. 32, respectively.

Subsequently, as shown in FIG. 35A, the photoresist 42 is removed.

Next, as shown in FIG. 35B, a metal layer 27 serving as the material of the contact layer, for example, W (tungsten) layer is formed on the whole surface so as to fill the contact hole and the groove (third groove) for the pad. Also, when the metal layer 27 is formed on the whole surface so as to fill the contact hole, a barrier metal layer may be formed on the underlayer in advance according to the need.

Then, as shown in FIG. 35C, the metal layer 27 is removed from the surface by the CMP method of the RIE method. As a result, the metal layer 27 is left within only the contact hole and the groove (third groove) for the pad and thereby the electrode layer 15 having the T-like cross-section composed of the horizontal-direction portion 15A serving as the pad and the vertical-direction portion 15B is formed.

Figures 36A, 36B, 36C:
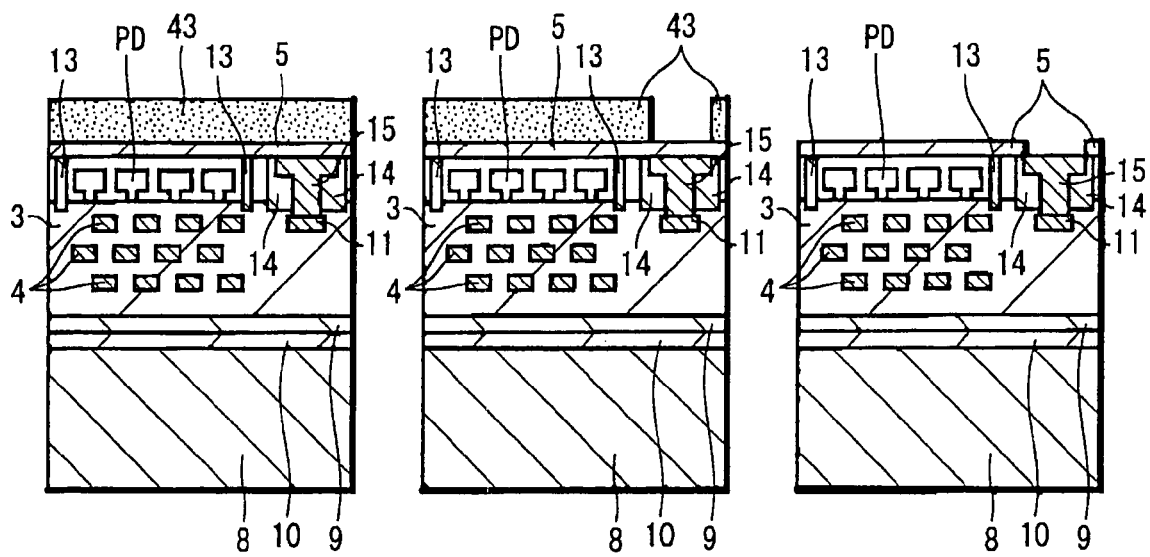
FIGS. 36A to 36C are process diagrams used to explain an example of a method of manufacturing a solid-state imaging device shown in FIG. 32, respectively.

Next, as shown in FIG. 36A, the planarized layer 5 and a photoresist 43 are formed on the surface, in that order. Then, as shown in FIG. 36B, a through-hole is formed on the photoresist 43 above the electrode layer 15 of the pad portion by exposing and developing the photoresist 43.

Next, after the planarized layer 5 was etched away by using the photoresist 43, the photoresist 43 is removed as shown in FIG. 36C, whereby the planarized layer 5 is removed from the electrode layer 15 of the pad portion to expose the electrode layer 15 to the surface.

Thereafter, through the processes similar to those shown in FIGS. 15C to 16B, respective assemblies up to the on-chip lens 7 are formed and the solid-state imaging device 120 shown in FIG. 32 can be manufactured.

According to the above-mentioned manufacturing process, the photodiode PD and the on-chip lens 7 can be formed without positional displacement by using the insulating layer 13 as the alignment mark. Also, it becomes possible to form the pad by the electrode layer 15 and hence the CMOS type solid-state imaging device with the back-illuminated type structure can be manufactured.

According to the above-mentioned solid-state imaging device 120 of this embodiment, similarly to the solid-state imaging device 1 according to the preceding embodiment, in the solid-state imaging device with the back-illuminated type structure, since the alignment mark for aligning the photodiode PD of the light-receiving sensor portion and the on-chip lens 7 and the pad can be formed, it becomes possible to realize the solid-state imaging device with the back-illuminated type structure.

As a result, it becomes possible to achieve the 100% of effective vignetting factor of slanting incident light by the back-illuminated type structure. Thus, sensitivity can be improved considerably, and hence it becomes possible to realize the solid-state imaging device which is free from the shading.

Also, in the solid-state imaging device 120 according to this embodiment, since the electrode layer 15 having the T-like cross-section is formed so as to be connected to the interconnection layer 11, in particular, in the pad portion, it becomes possible to form the contact layer and the electrode layer by the same process at the same time. Thus, it becomes possible to suppress the number of processes in the process for forming the contact layer. Further, since the contact layer and the electrode layer can be made of the same material at the same time, there is an advantage in which a contact resistance is not produced between the contact layer and the electrode layer.

While the insulating layer 13 and the metal layer 16 used as the alignment marks are left in the solid-state imaging devices 1, 110 and 120 according to the above-mentioned respective embodiments of the present invention, when an alignment mark is formed near the boundary between the adjacent chips 101 shown in FIG. 5A, if the wafer 100 is divided into the chips 101 by a suitable method such as dicing, then the alignment mark will be sometimes removed partly or wholly.

Furthermore, while the present invention is applied to the solid-state imaging device with the back-illuminated type structure according to the above-mentioned respective embodiments, the present invention is not limited thereto and can be similarly applied to a solid-state imaging device having other arrangement with a back-illuminated type structure.

For example, in a CCD (charge-coupled device) solid-state imaging device with a back-illuminated type structure or the like, it is possible to form an alignment mark and an electrode of a pad with application of the present invention.

According to the present invention, there is provided a solid-state imaging device including a structure comprising at least a silicon layer in which a light-receiving sensor portion for effecting photoelectric-conversion is formed, an interconnection layer formed on the surface side of this silicon layer and in which a lens is formed on the rear side opposite to the surface side of the silicon layer, an insulating layer being buried into the silicon layer around an image pickup region, the insulating layer being buried around a contact layer for connecting an electrode layer of a pad portion and the interconnection layer of the surface side.

According to the above-mentioned arrangement of the solid-state imaging device of the present invention, since this solid-state imaging device includes the structure comprising at least the silicon layer in which the light-receiving sensor portion for effecting photoelectric-conversion is formed and the interconnection layer formed on the surface side of this silicon layer and in which the lens is formed on the back side opposite to the surface side of the silicon layer, the solid-state imaging device having the so-called back-illuminated type structure is constructed in which the lens is formed on the rear side opposite to the surface side of the silicon layer.

Then, since the insulating layer is buried into the silicon layer around the image pickup region, when the solid-state imaging device is manufactured, it becomes possible to align the light-receiving sensor portion and the lens by using this insulating layer as the alignment mark.

Also, since the insulating layer is buried around the contact layer for connecting the electrode layer of the pad portion and the interconnection layer of the surface side, the contact layer and the silicon layer can be insulated from each other by the insulating layer and the pad portion can be constructed by connecting the electrode layer to the interconnection layer of the surface side through the contact layer.

According to the present invention, there is provided a solid-state imaging device including a structure comprising at least a first silicon layer in which a light-receiving sensor portion for effecting photoelectric-conversion is formed and which is formed of a single crystal silicon layer, an interconnection layer formed on the surface side of this first silicon layer and in which a lens is formed on the back side opposite to the surface side of the first silicon layer, a second silicon layer formed of an amorphous silicon layer or a polycrystalline silicon layer is buried into the first silicon layer around an image pickup region, an insulating layer is formed on the first silicon layer, a metal layer is buried into the insulating layer at its portion above the second silicon layer, the insulating layer is buried around a contact layer for connecting an electrode layer of a pad portion and an interconnection layer of the surface side and the second silicon layer is buried around the insulating layer.

According to the above-mentioned arrangement of the solid-state imaging device of the present invention, since this solid-state imaging device has the structure comprising at least the first silicon layer in which the light-receiving sensor portion for effecting photoelectric-conversion is formed and the interconnection layer formed on the surface side of the first silicon layer and in which the lens is formed on the back side opposite to the surface side of the first silicon layer, the solid-state imaging device having the so-called back-illuminated type structure is constructed in which the lens is formed on the back side opposite to the surface side of the first silicon layer.

Then, since the second silicon layer formed of the amorphous silicon layer or the polycrystalline silicon layer is buried into the first silicon layer around the image pickup region, the insulating layer is formed on the first silicon layer and the metal layer is buried into the insulating layer at its portion above the second silicon layer, when the solid-state imaging device is manufactured, it becomes possible to align the light-receiving sensor portion and the lens by using this metal layer as the alignment mark.

Also, since the insulating layer that is formed on the first silicon layer is buried around the contact layer for connecting the electrode layer of the pad portion and the interconnection layer of the surface side and the second silicon layer is buried around the insulating layer, the contact layer, the second silicon layer and the first silicon layer can be insulated from one another by the insulating layer, and the pad portion can be constructed by connecting the electrode layer to the interconnection layer of the surface side through the contact layer.

According to the present invention, a method of manufacturing a solid-state imaging device is a method of manufacturing a solid-state imaging device for manufacturing a solid-state imaging device including a structure comprising a silicon layer in which a light-receiving sensor portion for effecting photoelectric-conversion is formed and an interconnection layer formed on the surface side of this silicon layer and in which a lens is formed on the rear side opposite to the surface side of the silicon layer. This method of manufacturing a solid-state imaging device comprises the steps of a process for forming a groove on a silicon layer around an image pickup region, a process for forming a groove on a silicon layer of a pad portion, a process for burying an insulating layer into the groove formed around the image pickup region, a process for burying the insulating layer into the groove formed on the pad portion, a process for forming the light-receiving sensor portion on the silicon layer after the insulating layer was buried around at least the image pickup region, a process for forming an interconnection layer on the surface side of the silicon layer, a process for connecting an electrode layer to the interconnection layer of the pad portion by burying a conductive material into the insulating layer buried into the groove of the pad portion and a process for forming a lens on the rear side of the silicon layer by using the insulating layer buried into the groove around the image pickup region as an alignment mark.

According to the above-mentioned method of manufacturing a solid-state imaging device of the present invention, there can be manufactured the solid-state imaging device including the structure comprising at least the silicon layer in which the light-receiving sensor portion for effecting photoelectric-conversion is formed and the interconnection layer formed on the surface side of this silicon layer and in which the lens is formed on the back side opposite to the surface side of the silicon layer, that is, the solid-state imaging device having the so-called back-illuminated type structure.

Then, according to the above-mentioned method of manufacturing a solid-state imaging device of the present invention, since this manufacturing method comprises the process for forming the groove on the silicon layer around the image pickup region, the process for burying the insulating layer into the groove formed around the image pickup region, the process for forming the interconnection layer on the surface side of the silicon layer, the process for forming the light-receiving sensor portion on the silicon layer after the insulating layer was buried around at least the image pickup region and the process for forming the lens on the rear side of the silicon layer by using the insulating layer buried into the groove around the image pickup region as the alignment mark, it becomes possible to form the photodiode of the light-receiving sensor portion at the accurate position by using the insulating layer as the alignment mark and further it becomes possible to align the lens at the accurate position relative to the photodiode of the light-receiving sensor portion and the like.

Also, according to the present invention, this method of manufacturing a solid-state imaging device comprises the process for forming the groove on the silicon layer of the pad portion, the process for burying the insulating layer into the groove formed at the pad portion and the process for connecting the electrode layer to the interconnection layer of the pad portion by burying the conductive material into the insulating layer buried into the groove of the pad portion, the conductive material buried into the insulating layer is connected to the interconnection layer of the pad portion and the conductive material and the silicon layer are insulated from each other by the insulating layer. Thus, the pad electrode is formed by using the conductive material as the contact layer, thereby making it possible to form the pad portion.

According to the above-mentioned method of manufacturing a solid-state imaging device of the present invention, in the process for forming the groove on the silicon layer around the image pickup region, the silicon layer may be etched by using a silicon nitride layer as a mask, a silicon oxide layer may be buried into the groove as the insulating layer in the state in which the silicon nitride layer is left and the silicon oxide layer may be left only within the groove by removing the silicon oxide layer from the surface, whereafter the silicon oxide layer may be protruded on the surface by removing the silicon nitride layer and the light-receiving sensor portion may be formed on the silicon layer.

In this case, it becomes possible to form the photodiode of the light-receiving sensor portion and the like at the predetermined position by using the protruded silicon oxide layer as the alignment mark.

In the above-mentioned method of manufacturing a solid-state imaging device according to the present invention, it is possible to execute the process for forming the groove on the silicon layer around the image pickup region and the process for forming the groove on the silicon layer of the pad portion at the same time. Also, the process for burying the insulating layer into the groove formed around the image pickup region and the process for burying the insulating layer into the groove formed on the pad portion can be executed at the same time.

In this case, since the groove forming process and the process for burying the insulating layer into the groove are simultaneously around the image pickup region and the pad portion, it becomes possible to decrease the number of processes.

In the above-mentioned method of manufacturing a solid-state imaging device according to the present invention, it is further possible to separately execute the process for forming the groove on the silicon layer around the image pickup region, the process for burying the insulating layer into the groove formed around the image pickup region, the process for forming the groove on the silicon layer of the pad portion and the process for burying the insulating layer into the groove formed on the pad portion.

In this case, since the groove forming process and the process for burying the insulating layer into the groove are separately executed around the image pickup region and at the pad portion, it becomes possible to optimize the material of the insulating layer buried into the groove and the method of forming the groove in consideration of various characteristics such as burying property and an etching rate.

Furthermore, after the insulating layer was buried into the groove formed around the image pickup region, the process for forming the light-receiving sensor portion on the silicon layer can be executed, whereafter the groove can be formed on the silicon layer of the pad portion and the insulating layer can be buried into this groove. In this case, it is possible to form the photodiode of the light-receiving sensor portion and the like with high accuracy by using the insulating layer buried into the groove formed around the image pickup region as the alignment mark. Also, since the insulating layer buried into the groove of the pad portion is not used as the alignment mark, the material of the insulating layer can be selected freely.

In the above-mentioned method of manufacturing a solid-state imaging device according to the present invention, further, a second groove narrower than the width of the insulating layer and which reaches the interconnection layer of the pad portion through the insulating layer can be formed on the insulating layer buried into the groove of the pad portion, a third groove narrower than the width of the insulating layer and which is wider than the width of the second groove can be formed on the upper portion of the second groove and then the electrode layer can be connected to the interconnection layer of the pad portion by burying the conductive material into the second and third grooves.

In this case, the conductive material within the narrow second groove can act as the contact layer and it becomes possible to use the conductive material buried into the wider third groove formed on the upper portion of the second groove as the pad electrode. As a result, the contact layer and the pad electrode can be formed at the same time.

A method of manufacturing a solid-state imaging device according to the present invention is a method of manufacturing a solid-state imaging device including a structure comprising at least a first silicon layer in which a light-receiving sensor portion for effecting photoelectric-conversion is formed, an interconnection layer formed on the surface side of this first silicon layer and a lens formed on the rear side opposite to the surface side of the first silicon layer. This solid-state imaging device manufacturing method comprises a process for forming a groove on a first silicon layer around an image pickup region, a process for forming a groove on the first silicon layer of a pad portion, a process for burying a second silicon layer made of amorphous silicon or polycrystalline silicon into a groove formed around the image pickup region, a process for burying the second silicon layer made of amorphous silicon or polycrystalline silicon into the groove formed at the pad portion, a process for forming a light-receiving sensor portion on the first silicon layer after the second silicon layer was buried around at least the image pickup region, a process for forming an interconnection layer on the surface side of the first silicon layer, a process for connecting an electrode layer to the interconnection layer by burying a conductive material into the second silicon layer buried into the groove of the pad portion through an insulating layer and a process for forming the insulating layer over the first silicon layer, burying a metal layer into the insulating layer at its portion above the second silicon layer around the image pickup region and forming a lens on the rear side of the first silicon layer by using this metal layer as an alignment mark.

The above-mentioned method of manufacturing a solid-state imaging device according to the present invention is to manufacture a solid-state imaging device including a structure comprising at least a first silicon layer in which a light-receiving sensor portion for effecting photoelectric-conversion is formed, an interconnection layer formed on the surface side of this first silicon layer and a lens formed on the back side opposite to the surface side of the first silicon layer, that is, a solid-state imaging device having a so-called back-illuminated type structure.

Then, according to the above-mentioned method of manufacturing a solid-state imaging device of the present invention, since this solid-state imaging device manufacturing method comprises the process for forming the groove on the first silicon layer around the image pickup region, the process for burying the second silicon layer made of the amorphous silicon or polycrystalline silicon into the groove formed around the image pickup region, the process for forming the light-receiving sensor portion on the first silicon layer after the second silicon layer was buried around at least the image pickup region, the process for forming the interconnection layer on the surface side of the first silicon layer and the process for forming the insulating layer over the first silicon layer, burying the metal layer into the insulating layer at its portion above the second silicon layer around the image pickup region and forming the lens on the rear side of the first silicon layer by using this metal layer as the alignment mark, it becomes possible to accurately align the photodiode of the light-receiving sensor portion and the like at the predetermined position by using the second silicon layer around the image pickup region as the alignment mark. Further, it becomes possible to form the lens with the accurate alignment relative to the photodiode of the light-receiving sensor portion and the like by using the metal layer formed on the portion above the second silicon layer around the image pickup region as the alignment mark.

Also, since the solid-state imaging device manufacturing method according to the present invention comprises the process for forming the groove on the first silicon layer of the pad portion, the process for burying the second silicon layer made of the amorphous silicon or the polycrystalline silicon into the groove formed on the pad portion and the process for connecting the conductive material to the interconnection layer by burying the conductive material into the second silicon layer buried into the groove of the pad portion through the insulating layer, the conductive material buried into the second silicon layer through the insulating layer is connected to the interconnection layer of the pad portion and the conductive material and the second silicon layer are insulated from each other by the insulating layer. In consequence, the pad electrode can be formed by using the conductive material as the contact layer, thereby making it possible to form the pad portion.

In the above-mentioned method of manufacturing a solid state image pickup device according to the present invention, further, the process for forming the groove on the first silicon layer around the image pickup region and the process for forming the groove on the first silicon layer of the pad portion can be executed at the same time. Also, the process for burying the second silicon layer into the groove formed around the image pickup region and the process for burying the second silicon layer into the groove formed at the pad portion can be executed at the same time.

In this case, since the groove forming process and the process for burying the second silicon layer into the groove are executed around the image pickup region and at the pad portion at the same time, it becomes possible to decrease the number of processes.

In the above-mentioned method of manufacturing a solid-state imaging device according to the present invention, further, the process for forming the first silicon layer around the image pickup region and the process for burying the second silicon layer into the groove formed around the image pickup region and the process for forming the groove on the first silicon layer of the pad portion and the process for burying the second silicon layer into the groove formed at the pad portion can be executed separately.

In this case, since the groove forming process and the process for burying the second silicon layer into the groove are executed around the image pickup region and at the pad portion separately, it becomes possible to optimize the material (amorphous silicon or polycrystalline silicon) of the second silicon layer buried into the groove and the forming method in consideration of various characteristics such as a burying property and an etching rate.

Further, after the second silicon layer was buried into the groove formed around the image pickup region, the light-receiving sensor portion can be formed on the first silicon layer, whereafter the groove can be formed on the first silicon layer of the pad portion and the second silicon layer can be buried into this groove. In this case, it becomes possible to form the photodiode of the light-receiving sensor portion and the like accurately by using the second silicon layer buried into the groove formed around the image pickup region as the alignment mark. Also, since the second silicon layer buried into the groove of the pad portion is not used as the alignment mark, the material can be selected freely.

In the above-mentioned method of manufacturing a solid-state imaging device according to the present invention, further in the process for forming the groove on the first silicon layer around the image pickup region, the first silicon layer may be etched by using the insulating layer as a mask, the second silicon layer may be buried into the groove in the state in which the insulating layer is left, the second silicon layer may be left only within the groove by removing the second silicon layer from the surface, the second silicon layer may be protruded on the surface by removing the insulating layer and the light-receiving sensor portion may be formed on the first silicon layer.

In this case, it becomes possible to form the photodiode of the light-receiving sensor portion and the like at the predetermined position by using the thus protruded second silicon layer as the alignment mark.

According to the above-mentioned present invention, it becomes possible to align the light-receiving sensor portion (photodiode, etc.) and the lens by using the insulating layer buried into the groove around the image pickup region or the second silicon layer buried into the groove around the image pickup region and the metal layer formed on the second silicon layer as the alignment mark.

In consequence, also in the solid-state imaging device having the back-illuminated type structure, it becomes possible to align the light-receiving sensor portion (photodiode, etc.) and the lens at the predetermined position accurately.

Further, according to the present invention, it becomes possible to form a pad by connecting the electrode layer and the interconnection layer after the contact layer was formed by connecting the interconnection layer formed on the surface side in the pad portion.

Thus, it becomes possible to form the pad in the solid-state imaging device having the back-illuminated type structure too.

Therefore, according to the present invention, it becomes possible to realize the solid-state imaging device having the back-illuminated type structure. Also, it becomes possible to achieve an effective vignetting factor of 100% of slanting incident light by the back-illuminated type structure. Furthermore, it becomes possible to considerably improve sensitivity and to realize the solid-state imaging device having the back-illuminated type structure which is free from the shading.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A solid-state image pickup device comprising:
   a structure including at least a silicon layer, a light-receiving portion including at least one photodiode for effecting photoelectric-conversion formed in said silicon layer, an interconnection layer formed on a surface side of said silicon layer, and a lens formed at a rear side opposite to said surface side of said silicon layer;
   a pad on said rear side of said silicon layer;
   a first insulating layer formed on a sidewall of said pad; and
   a second insulating layer formed at a peripheral portion of the light-receiving portion.

2. A solid-state image pickup device according to claim 1, wherein said pad extends through said silicon layer.

3. A solid-state image pickup device according to claim 1, wherein the second insulating layer traverses through the silicon layer such that an upper end of the second insulating layer is flush with the rear side opposite to said surface side of said silicon layer and a lower end of the second insulating layer protrudes past the surface side of said silicon layer.

4. A solid-state image pickup device according to claim 3, wherein said first insulating layer is formed concurrently with said second insulating layer.

5. A solid-state image pickup device according to claim 3, wherein said second insulating layer has a reflectivity different from the silicon layer.

6. A solid-state image pickup device according to claim 2, wherein said pad is a pad portion constructed by connecting an electrode layer to the interconnection layer of the surface side through a contact layer.

7. A solid-state image pickup device comprising:
   a silicon layer that has an upper surface that is parallel to a lower surface;
   a photoelectric-conversion portion including at least one photodiode;
   an interconnection layer on a lower surface side of the silicon layer;
   a pad portion that extends through the silicon layer;
   a filter portion,
   wherein the photoelectric-conversion portion is configured along a first axis that is parallel to and between the upper and lower surfaces, and
   wherein the filter portion is configured on the upper surface and configured along a second axis that aligns with the photoelectric-conversion portion and that is normal to the first axis; and
   an insulating layer
      that traverses through the silicon layer such that an upper end of the insulating layer is flush with the upper surface of the silicon layer and a lower end of the insulating layer protrudes past the lower surface of the silicon layer,
      that is peripheral to the photoelectric-conversion portion, and
      that has a reflectivity different from the silicon layer.

8. A solid-state image pickup device according to claim 7, wherein the pad portion connects the interconnection layer to an electrode portion on the upper surface.
   wherein interconnection layer connects the photoelectric-conversion portion to the pad.

9. A solid-state image pickup device according to claim 7, wherein the filter portion comprises a lens and a color filter.

10. A solid-state image pickup device according to claim 1, wherein the interconnection layer includes a set of interconnection portions sequentially formed within a border insulation layer formed on a surface side of said silicon layer that connect each of a set of photodiodes, which includes the at least one photodiode, located in a light-receiving portion to the pad.

* * * * *